(12) United States Patent
Lai

(10) Patent No.: US 8,994,488 B2
(45) Date of Patent: Mar. 31, 2015

(54) TRANSFORMER POWER SPLITTER HAVING PRIMARY WINDING CONDUCTORS MAGNETICALLY COUPLED TO SECONDARY WINDING CONDUCTORS AND CONFIGURED IN TOPOLOGY INCLUDING SERIES CONNECTION AND PARALLEL CONNECTION

(75) Inventor: Jie-Wei Lai, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 1153 days.

(21) Appl. No.: 12/831,270

(22) Filed: Jul. 7, 2010

(65) Prior Publication Data

US 2010/0270999 A1 Oct. 28, 2010

Related U.S. Application Data

(63) Continuation-in-part of application No. 12/242,892, filed on Sep. 30, 2008, now Pat. No. 7,777,570.

(60) Provisional application No. 61/035,740, filed on Mar. 12, 2008.

(51) Int. Cl.
*H01F 17/04* (2006.01)
*H01F 19/04* (2006.01)
*H01F 27/28* (2006.01)
(Continued)

(52) U.S. Cl.
CPC .......... *H01F 27/2804* (2013.01); *H01F 19/04* (2013.01); *H03F 3/602* (2013.01); *H03F 2200/537* (2013.01); *H03F 2200/541* (2013.01);
(Continued)

(58) Field of Classification Search
USPC .................................. 336/200, 232
See application file for complete search history.

(56) References Cited

U.S. PATENT DOCUMENTS 3,815,030 A 6/1974 Morrison
3,818,030 A 6/1974 Timmler
(Continued)

FOREIGN PATENT DOCUMENTS

GB 2 445 677 A 7/2008
JP S6382007 A 4/1988
(Continued)

OTHER PUBLICATIONS

P. Haldi et al., "CMOS compatible transformer power combiner", Electronics Letters, USA, IEEE, Sep. 14, 2006, vol. 42 No. 19, p. 1091-1092.
(Continued)

*Primary Examiner* — Tuyen Nguyen
(74) *Attorney, Agent, or Firm* — Winston Hsu; Scott Margo

(57) ABSTRACT

A transformer power splitter has a plurality of output ports and an input port. The transformer power splitter includes a plurality of primary winding conductors and a plurality of secondary winding conductors. The secondary winding conductors are electrically connected to the output ports respectively. Each of the secondary winding conductors is electrically connected between a positive terminal and a negative terminal of a corresponding output port. The primary winding conductors are magnetically coupled to the secondary winding conductors respectively. The primary winding conductors are configured in a topology including series and parallel connections between a positive terminal and a negative terminal of the input port.

13 Claims, 17 Drawing Sheets

(51) Int. Cl.
*H03F 3/60* (2006.01)
*H04B 1/04* (2006.01)

(52) U.S. Cl.
CPC ........ *H03F 2200/543* (2013.01); *H04B 1/0483* (2013.01)
USPC .......................................................... 336/221

(56) References Cited

U.S. PATENT DOCUMENTS

| | | | |
|---|---|---|---|
| 4,914,561 A | 4/1990 | Rice | |
| 4,994,760 A | 2/1991 | Roehrs | |
| 5,389,890 A | 2/1995 | Burrage | |
| 5,572,179 A * | 11/1996 | Ito et al. | 336/200 |
| 6,549,071 B1 | 4/2003 | Paul | |
| 6,972,656 B2 | 12/2005 | Takeshima | |
| 7,129,784 B2 | 10/2006 | Bhatti | |
| 7,149,096 B2 | 12/2006 | Batarseh | |
| 2002/0135422 A1 | 9/2002 | Aoki | |
| 2003/0067672 A1 | 4/2003 | Bodeep | |
| 2004/0207504 A1 | 10/2004 | Yang | |
| 2005/0180173 A1 | 8/2005 | Batarseh | |
| 2005/0242916 A1 | 11/2005 | So | |
| 2008/0094164 A1 | 4/2008 | Hsu | |
| 2009/0174515 A1 | 7/2009 | Lee | |

FOREIGN PATENT DOCUMENTS

| | | |
|---|---|---|
| JP | H08237063 A | 9/1996 |
| JP | 2005503679 A | 2/2005 |
| JP | 2008514090 A | 5/2008 |
| TW | 420392 | 1/2001 |
| TW | 200707722 | 2/2007 |

OTHER PUBLICATIONS

Nai-Shuo Cheng, "40-W CW Broad-Band Spatial Power Combiner Using Dense Finline Arrays", TMTT, p. 1070, 1999.
Patrick Reynaert, "A 2.45-GHz 0.13-um CMOS PA With Parallel Amplification", JSSC, p. 551, 2007.
Nebil Tanzi, "A 1-Watt Doubly Balanced 5GHz Flip-Chip SiGe Power Amplifier", RFIC, p. 141, 2003.
Jeng-Han Tsai, "A 90-nm CMOS Broadband and Miniature Q-band Balanced Medium Power Amplifier", MTT-S, p. 1129, 2007.
Kyu Hwan An, "A Monolithic Voltage-Boosting Parallel-Primary Transformer Structures for Fully Integrated CMOS Power Amplifier Design", RFIC, p. 419, 2007.
Avantek, GaAs IC system, p. 267, 1989.

* cited by examiner

TRANSFORMER POWER SPLITTER HAVING PRIMARY WINDING CONDUCTORS MAGNETICALLY COUPLED TO SECONDARY WINDING CONDUCTORS AND CONFIGURED IN TOPOLOGY INCLUDING SERIES CONNECTION AND PARALLEL CONNECTION

CROSS REFERENCE TO RELATED APPLICATIONS

This continuation-in-part application claims the benefit of co-pending U.S. patent application Ser. No. 12/242,892 (filed on Sep. 30, 2008) which claims the benefit of U.S. Provisional Application No. 61/035,740 (filed on Mar. 12, 2008). The entire contents of these related applications are incorporated herein by reference.

BACKGROUND

The present invention relates to splitting the input power of an input signal and accordingly generating a plurality of output signals, and more particularly, to an on-chip transformer power splitter implemented in a system that has high transformer coupling efficiency and high power splitting efficiency.

Power combining technique is commonly employed in a power amplifier of a wireless communication system to provide signals to be transmitted (e.g., RF signals) with sufficient signal power. One possible power combining implementation is to use a transformer power combiner. Please refer to FIG. 1, which is a schematic diagram illustrating a conventional power amplifier system. The power amplifier system 100 includes a transformer power combiner 102 and a plurality of power amplifiers 104_1, 104_2, ..., 104_N. Each of the power amplifiers 104_1, 104_2, ..., 104_N can be modeled by an RF current source $i_1, i_2, \ldots, i_N$ connected to an impedance $r_S$ in parallel. In addition, parasitic impedance r also exists in the transformer power combiner 102.

Provided that the turn ratio is 1:1, the output voltage across the load impedance $r_L$ is equal to a sum of the input voltage levels $V_1, V_2, \ldots, V_N$ respectively presented at the input ports of the transformer power combiner 102. The input impedance $Z_{in}$ seen by a specific power amplifier at a corresponding input port can be expressed as equation (1) below:

$$Z_{in,i} = \frac{\left(2r + \frac{r_L}{N}\right)i_i + r_S\left(i_i - \frac{1}{N}\sum_{i=1}^{N}i_i\right)}{\frac{1}{N}\sum_{i=1}^{N}i_i} \quad (1)$$

In an ideal case where $i_1 = i_2 = \ldots = i_j = \ldots = i_N$ (i.e., the current i flowing through each primary winding is equal to the current i flowing through the secondary windings), the input impedance seen by each power amplifier is the same, namely $$Z_{in} = 2r + \frac{r_L}{N}.$$

In other words, in the ideal case, the input signals fed into the input ports of the transformer power combiner 102 are constructively synchronous with one another in phase and amplitude, whereby the optimum power combining efficiency could be achieved for delivering maximum power at the output port of the transformer power combiner 102. However, for the on-chip transformer power combiner employed in the power amplifier system manufactured utilizing a silicon technology such as a CMOS technology, the capacitive coupling among the primary and secondary windings adversely exists. As a result, the input signals fed into the input ports of the transformer power combiner 102 do not keep synchronous with one another because the input impedance seen by each power amplifier is not equal to the same value due to the undesired capacitive coupling.

For example, in a case where $$i_j = -\sum_{\substack{i=1 \\ i \neq j}}^{N} i_i$$

caused by the undesired capacitive coupling, the corresponding input impedance $Z_{in,j}$ is infinitely large (i.e., $Z_{in,j} = \infty$), meaning that the input port is an open circuit; in another case where $$\left(i_j + \sum_{\substack{i=1 \\ i \neq j}}^{N} i_i\right) < 0$$

caused by the undesired capacitive coupling, the corresponding input impedance $Z_{in,j}$ is a negative value (i.e., $Z_{in,j} < 0$), meaning that the system would become unstable.

Briefly summarized, the on-chip transformer power combiner under deep-scaled technology is sure to suffer greatly from the capacitive coupling. For example, the load impedance seen by the power amplifier may not match to an optimum impedance value desired by the power amplifier. As a result, the power combining efficiency is degraded and the actual output power fails to reach the maximum value as desired. Furthermore, it is possible that the load impedance seen by the power amplifier becomes negative. As a result, power delivered from the power amplifier would be returned from the output port of the transformer power combiner, resulting in system unstability. In addition, as illustrated by the aforementioned equation (1) showing that the input impedance at each input port is highly dependent upon characteristics of other input ports, the nonlinearity of the output power generated from the transformer power combiner occurs due to the varying amplitude/phase of the input signal fed into each input port of the transformer power combiner.

There are many conventional ways to implement the transformer using metal conductors routed in an integrated circuit. For example, an on-chip transformer can be implemented using a one-side coplanar design, a two-side coplanar design, a broadside design, or a hybrid design. In general, the on-chip transformer with better coupling efficiency and less coupling loss causes more capacitive coupling among the primary and secondary windings, thus resulting in poor power combining efficiency and/or system instability as mentioned above. That is, using highly resistive and highly capacitive metal layers in deep scaled technology to build circuit components induces large coupling capacitance for the low-loss transformer design, leading to imbalanced and inefficient power combining result, especially for high-frequency application (e.g., the mmWave application). In a worst case, the overall system is unstable.

Therefore, these is a trade-off between two design parameters, transformer efficiency and power combining efficiency, for the conventional on-chip transformer power combiner design. A solution which can unbind these two design parameters is highly desired for power amplifier systems, especially for those power amplifier systems operated under high frequency such as the frequency about 60 GHz or above in mmWave application.

Regarding the power splitting technique, it is also commonly employed in a wireless communication system to accept an input signal (e.g., an RF signal) and then deliver multiple output signals with specific phase and amplitude characteristics. One possible power splitting implementation is to use a transformer power splitter. In an ideal case, the output signals appearing at the output ports of the transformer power splitter are synchronous with one another in phase and amplitude, whereby the optimum power splitting efficiency could be achieved due to evenly splitting the input power at the input port of the transformer power splitter. However, for the on-chip transformer power splitter employed in the power splitting system manufactured utilizing a silicon technology such as a CMOS technology, the capacitive coupling among the primary and secondary windings adversely exists. As a result, the power splitting efficiency may be degraded. As mentioned above, these is a trade-off between two design parameters, transformer efficiency and power combining efficiency, for the conventional on-chip transformer power combining design. Similarly, these is also a trade-off between two design parameters, transformer efficiency and power splitting efficiency, for the conventional on-chip transformer power splitter design. Therefore, a solution which can unbind these two design parameters is also highly desired for wireless communication systems, especially for those wireless communication systems operated under high frequency such as the frequency about 60 GHz or above in mmWave application.

SUMMARY

One of the objectives of the present invention is therefore to provide a transformer power splitter having primary winding conductors magnetically coupled to secondary winding and configured in a topology including series connection and parallel connection.

According to one aspect of the present invention, an exemplary transformer power splitter having a plurality of output ports and an input port is disclosed. The exemplary transformer power splitter includes a plurality of primary winding conductors and a plurality of secondary winding conductors. The secondary winding conductors are electrically connected to the output ports respectively, wherein each of the secondary winding conductors is electrically connected between a positive terminal and a negative terminal of a corresponding output port. The primary winding conductors are magnetically coupled to the secondary winding conductors respectively, wherein the primary winding conductors are configured in a topology including series and parallel connections between a positive terminal and a negative terminal of the input port.

According to another aspect of the present invention, an exemplary transformer power splitter is disclosed. The exemplary transformer power splitter includes a plurality of voltage splitters coupled in parallel, and a current splitter. The voltage splitters include a plurality of primary winding conductors magnetically coupled to a plurality of secondary winding conductors respectively, wherein each of the voltage splitters is configured to split a voltage across two ends thereof into voltages across therein. The current splitter is coupled to a parallel connection of the voltage splitters, and is configured to split a current corresponding to an input of the transformer power splitter into currents flowing through the voltage splitters.

According to yet another aspect of the present invention, an exemplary transformer power splitter is disclosed. The exemplary transformer power splitter includes a plurality of current splitters coupled in series, and a voltage splitter. The current splitters include a plurality of primary winding conductors magnetically coupled to a plurality of secondary winding conductors respectively, wherein each of the current splitters is configured to split a current flowing thereto. The voltage splitter is coupled to a series connection of the current splitter, and is configured to split a voltage corresponding to an input of the transformer power splitter into voltages across the current splitters.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 2:
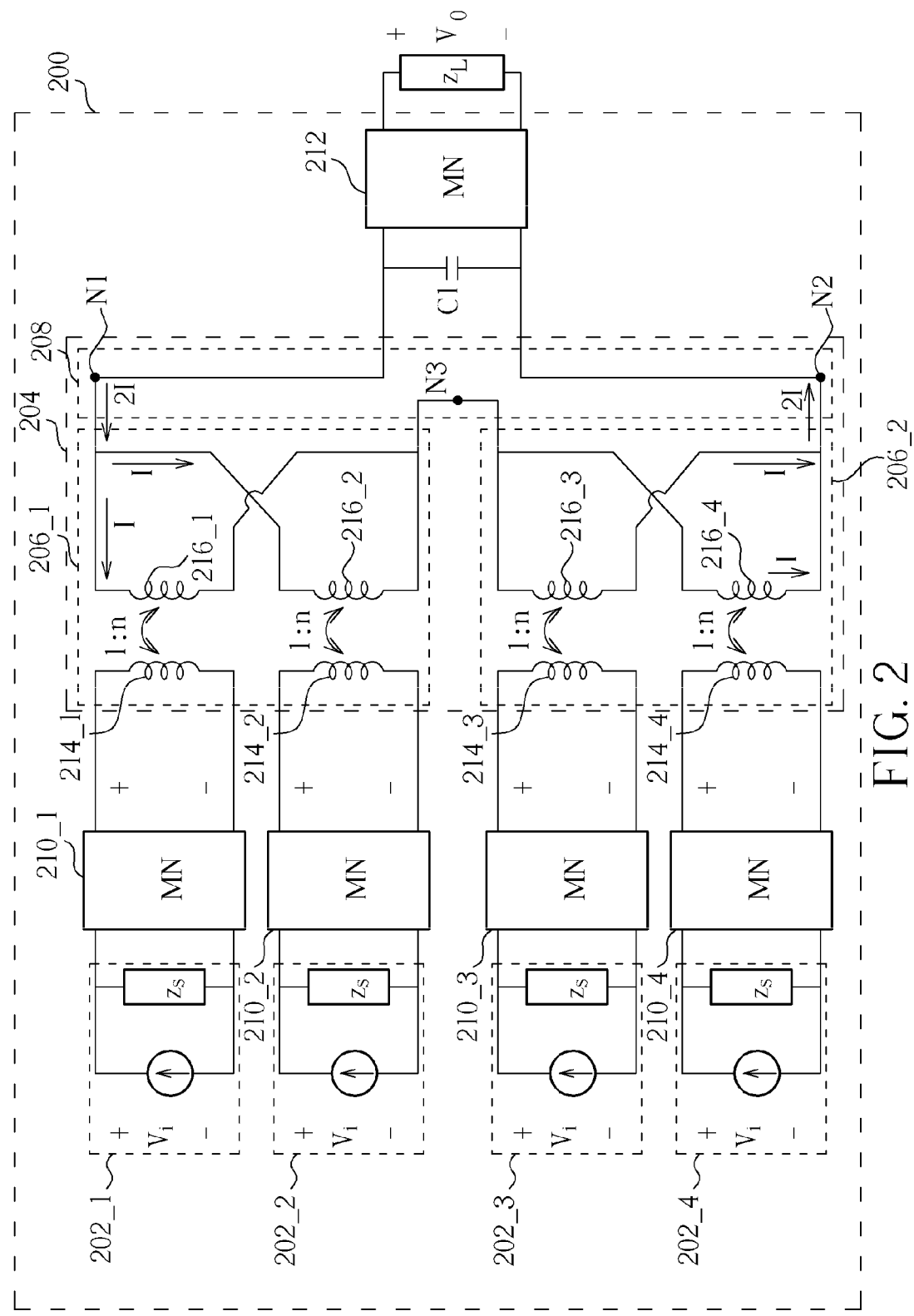
FIG. 2 is a schematic diagram illustrating a first exemplary embodiment of a power amplifier system according to the present invention.

FIG. 2 is a schematic diagram illustrating a first exemplary embodiment of a power amplifier system according to the present invention. The exemplary power amplifier system 200 includes a plurality of power amplifiers 202_1, 202_2, 202_3, 202_4 and a transformer power combiner 204. The transformer power combiner 204 has a plurality of input ports respectively coupled to the power amplifiers 202_1-202_4, and an output port coupled to an output load $Z_L$. The transformer power combiner 204 is configured to include current combiners 206_1 and 206_2 formed by a plurality of primary winding conductors 214_1, 214_2, 214_3, 214_4 and a plurality of secondary winding conductors 216_1, 216_2, 216_3, 216_4; in addition, the transformer power combiner 204 also includes a voltage combiner 208. Each of the current combiners 206_1 and 206_2 is configured to combine currents flowing therethrough (e.g., 2I=I+I), and the voltage combiner 208 is configured to combine voltages across the current combiners (e.g., the voltage between N1 and N3 and the voltage between N3 and N2) to generate an output $V_o$ at the output port.

As shown in FIG. 2, the primary winding conductor 214_1 is electrically connected between a positive terminal (+) and a negative terminal (−) of a corresponding input port and is further magnetically coupled to the secondary winding conductor 216_1, the primary winding conductor 214_2 is electrically connected between a positive terminal (+) and a negative terminal (−) of a corresponding input port and is further magnetically coupled to the secondary winding conductor 216_2, the primary winding conductor 214_3 is electrically connected between a positive terminal (+) and a negative terminal (−) of a corresponding input port and is further magnetically coupled to the secondary winding conductor 216_3, and the primary winding conductor 214_4 is electrically connected between a positive terminal (+) and a negative terminal (−) of a corresponding input port and is further magnetically coupled to the secondary winding conductor 216_4. In addition, a plurality of matching networks (MNs) 210_1, 210_2, 210_3, 210_4, 212 are also implemented in the power amplifier system 200 for impedance matching purposes. As the implementation of the matching networks are well known to those skilled in the art, further description is omitted here for brevity. In this exemplary embodiment shown in FIG. 2, only four power amplifiers 202_1-202_4 are shown for illustrative purposes; however, this is not meant to be a limitation of the present invention. In other alternative designs obeying the spirit of the present invention, the transformer power combiner can be implemented for combining power of more than four power amplifiers, depending upon design considerations.

Figure 1:
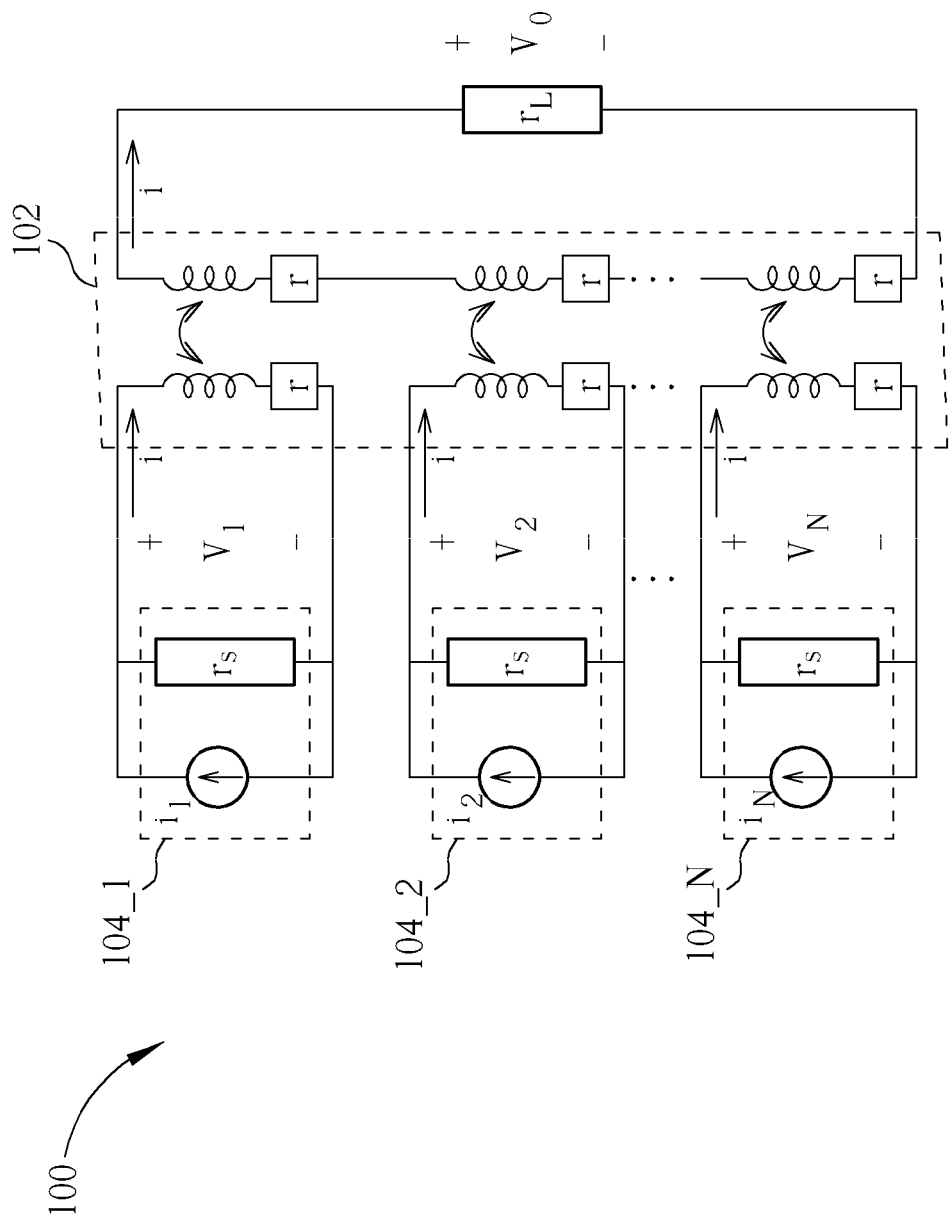
FIG. 1 is a schematic diagram illustrating a conventional power amplifier system.

As shown in FIG. 1, the secondary winging conductors configured in the conventional transformer power combiner are connected in series. In contrast to the conventional design, the secondary winding conductors 216_1-216_4 in the exemplary embodiment shown in FIG. 2, however, are configured in a topology including series connection and parallel connection between a positive terminal N1 and a negative terminal N2 of the output port of the transformer power combiner 204. More specifically, the secondary winding conductors 216_1 and 216_2 are connected in parallel between the positive terminal N1 of the output port and a connecting node N3, and the secondary winding conductors 216_3 and 216_4 are connected in parallel between the connecting node N3 and the negative terminal N2 of the output port. Provided that the turn ratio is 1:1, the impedance seen by the power amplifier 202_1 is therefore determined by the secondary winding conductor 216_1 connected to the secondary winding conductor 216_2 in parallel and then further connected to a parallel connection of the secondary winding conductors 216_3 and 216_4 in series; similarly, the impedance seen by the power amplifier 202_2 is therefore determined by the secondary winding conductor 216_2 connected to the secondary winding conductor 216_1 in parallel and then further connected to a parallel connection of the secondary winding conductors 216_3 and 216_4 in series, the impedance seen by the power amplifier 202_3 is therefore determined by the secondary winding conductor 216_3 connected to the secondary winding conductor 216_4 in parallel and then further connected to a parallel connection of the secondary winding conductors 216_1 and 216_2 in series, and the input impedance seen by the power amplifier 202_4 is therefore determined by the secondary winding conductor 216_4 connected to the secondary winding conductor 216_3 in parallel and then further connected to a parallel connection of the secondary winding conductors 216_1 and 216_2 in series. As one can see, the input impedance seen by each of the power amplifier 202_1-202_4 is the same due to the secondary winding conductors 216_1-216_4 connected through a novel topology including series connection and parallel connection between the positive terminal N1 and the negative terminal N2 of the output port. In this way, if the power amplifiers 202_1-202_4 are well-designed such that each power amplifier is modeled by the same RF current source and the same impedance $Z_S$, all of the input signals $V_i$ generated from the power amplifiers 202_1-202_4 would be synchronous with one another, resulting in synchronous amplitude/phase of the input current/voltage of the transformer power combiner 204.

Figure 3:
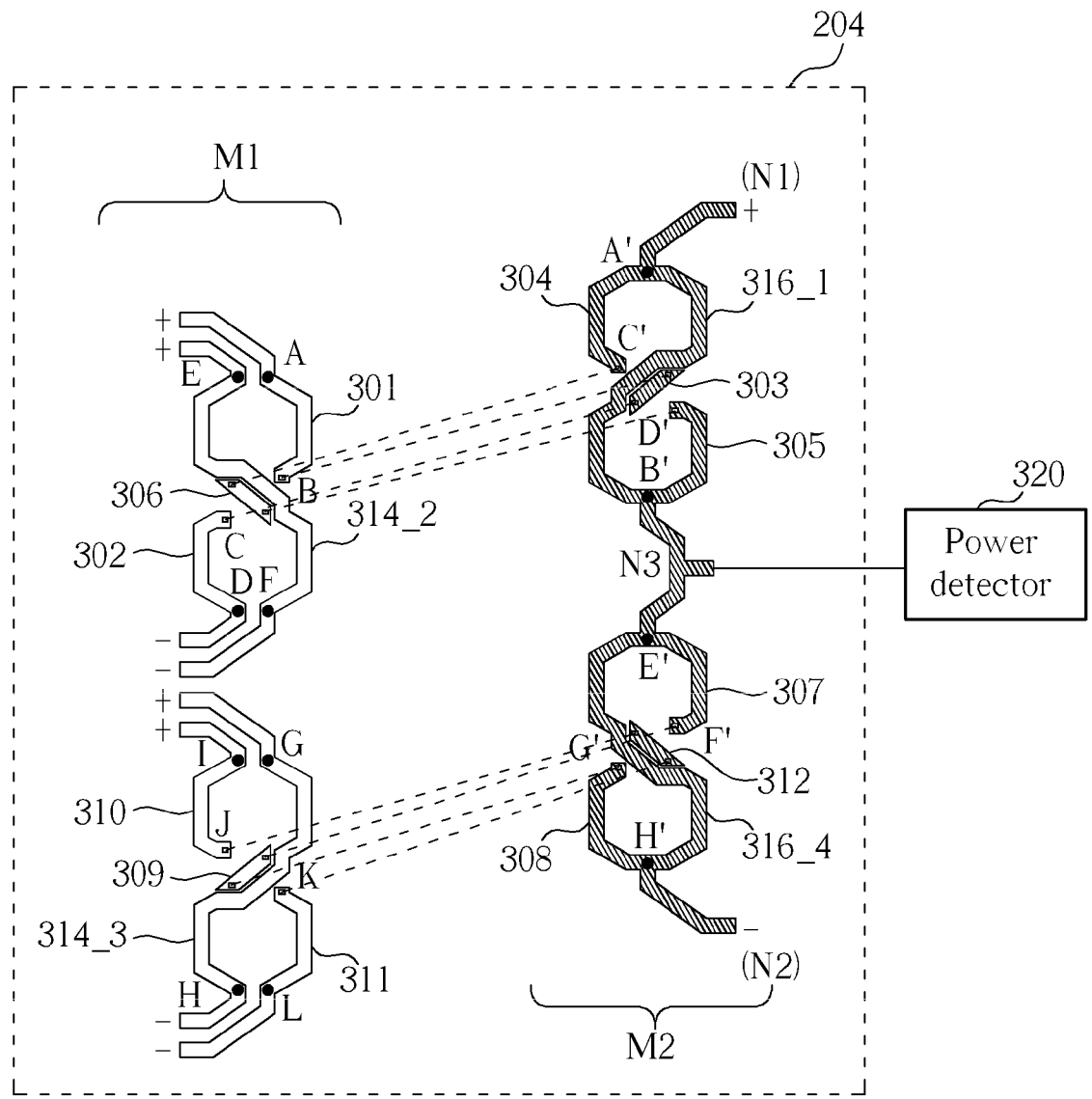
FIG. 3 is a diagram illustrating an exemplary layout of a transformer power combiner according to the present invention.

Based on the configuration of the novel transformer power combiner 204 shown in FIG. 2, a layout of the on-chip transformer power combiner 204 should be well defined in an integrated circuit to achieve the desired objective of making the input impedance seen by each of the power amplifiers 202_1-202_4 substantially the same. Please refer to FIG. 3, which is a diagram illustrating an exemplary layout of a transformer power combiner according to the present invention. For example, in one implementation, the exemplary layout shown in FIG. 3 is designed to realize the transformer power combiner 204 in FIG. 2. Shown on the left side are conductive metal lines routed on a first metal layer M1, while shown on the right side are conductive metal lines routed on a second metal layer M2 different from the first metal layer M1. Please note that the naming of the metal layers is not meant to limit the position relationship of the first and second metal layers. For example, in one implementation, the first metal layer is configured to be disposed under the second metal layer; however, in another implementation, the first metal layer could be alternatively disposed above the second metal layer. In short, the metal layers on which the primary and secondary winding conductors are routed depend upon design requirements. In addition, it should be noted that the layout design shown in FIG. 3 is for illustrative purposes only, and is not meant to be a limitation of the present invention. That is to say, other alternative layout designs obeying the spirit of the present invention still fall within the scope of the present invention.

As clearly illustrated in FIG. 3, a partial layout of the transformer power combiner 204 on the first metal layer M1 is substantially symmetric, and a partial layout of the transformer power combiner 204 on the second metal layer M2 is substantially symmetric as well. In this exemplary embodiment, a primary winding conductor, which is used for implementing the primary winding conductor 214_1 in FIG. 2, includes a first section 301 (between nodes A and B) and a second section 302 (between nodes C and D) routed on the first metal layer M1, and a third section 303 routed on the second metal layer M2 and interconnecting the first section 301 and the second section 302 through vias represented by broken lines illustrated in FIG. 3; a secondary winding conductor 316_1, which is used for implementing the secondary winding conductor 216_1 in FIG. 2 (and corresponds to the primary winding conductor used for implementing the primary winding conductor 214_1 in FIG. 2), is routed on the second metal layer between nodes A' and B', where node A' is electrically connected to the positive terminal N1 of the output port and node B' is electrically connected to the connecting node N3. A primary winding conductor 314_2 used for implementing the primary winding conductor 214_2 in FIG. 2 is routed on the first metal layer M1 between nodes E and F. A projected pattern of the third section 303 on the first metal layer M1 intersects the primary winding conductor 314_2, which is more clearly shown in following figures. A secondary winding conductor, which is used for implementing the secondary winding conductor 216_2 in FIG. 2 and corresponds to the primary winding conductor 314_2, has a first section 304 (between nodes A' and C') and a second section 305 (between nodes D' and B') routed on the second metal layer M2, and a third section 306 routed on the first metal layer M1 and interconnecting the first section 304 and the second section 305 through vias represented by broken lines. A projected pattern of the third section 306 on the second metal layer M2 intersects the secondary winding conductor 316_1, which is more clearly shown in following figures.

A primary winding conductor 314_3, which is used for implementing the primary winding conductor 214_3 in FIG. 2, is routed on the first metal layer M1 between nodes G and H; a secondary winding conductor, which is used for implementing the secondary winding conductor 216_3 in FIG. 2 and corresponds to the primary winding conductor 314_3, has a first section 307 (between nodes E' and F') and a second section 308 (between nodes G' and H') routed on the second metal layer M2, and a third section 309 routed on the first metal layer M1 and interconnecting the first section 307 and the second section 308 through vias represented by broken lines. A primary winding conductor used for implementing the primary winding conductor 214_4 in FIG. 2 has a first section 310 (between nodes I and J) and a second section 311 (between nodes K and L) routed on the first metal layer M1, and a third section 312 routed on the second metal layer M2 and interconnecting the first section 310 and the second section 311 through vias represented by broken lines. A projected pattern of the third section 312 on the first metal layer M1 intersects the primary winding conductor 314_3, which is more clearly shown in following figures. A secondary winding conductor 316_4, which is used for implementing the secondary winding conductor 216_4 in FIG. 2, is routed between nodes E' and H' on the second metal layer M2. As one can see, node E' is electrically connected to the connecting node N3, and node H' is electrically connected to the negative terminal N2 of the output port; in addition, a projected pattern of the third section 309 on the second metal layer M2 intersects the secondary winding conductor 316_4, which is more clearly shown in the following figures.

Furthermore, the connecting node N3 shown in FIG. 2 could be coupled to a power detector 320 used for detecting power at the output port of the transformer power combiner 204. Therefore, based on the power detection result, other circuits can adjust the power of the power amplifiers connected to input ports of the transformer power combiner 204. However, such a power detector configuration is optional. In other words, the power detector 320 could be omitted according to actual design requirements.

Figure 4:
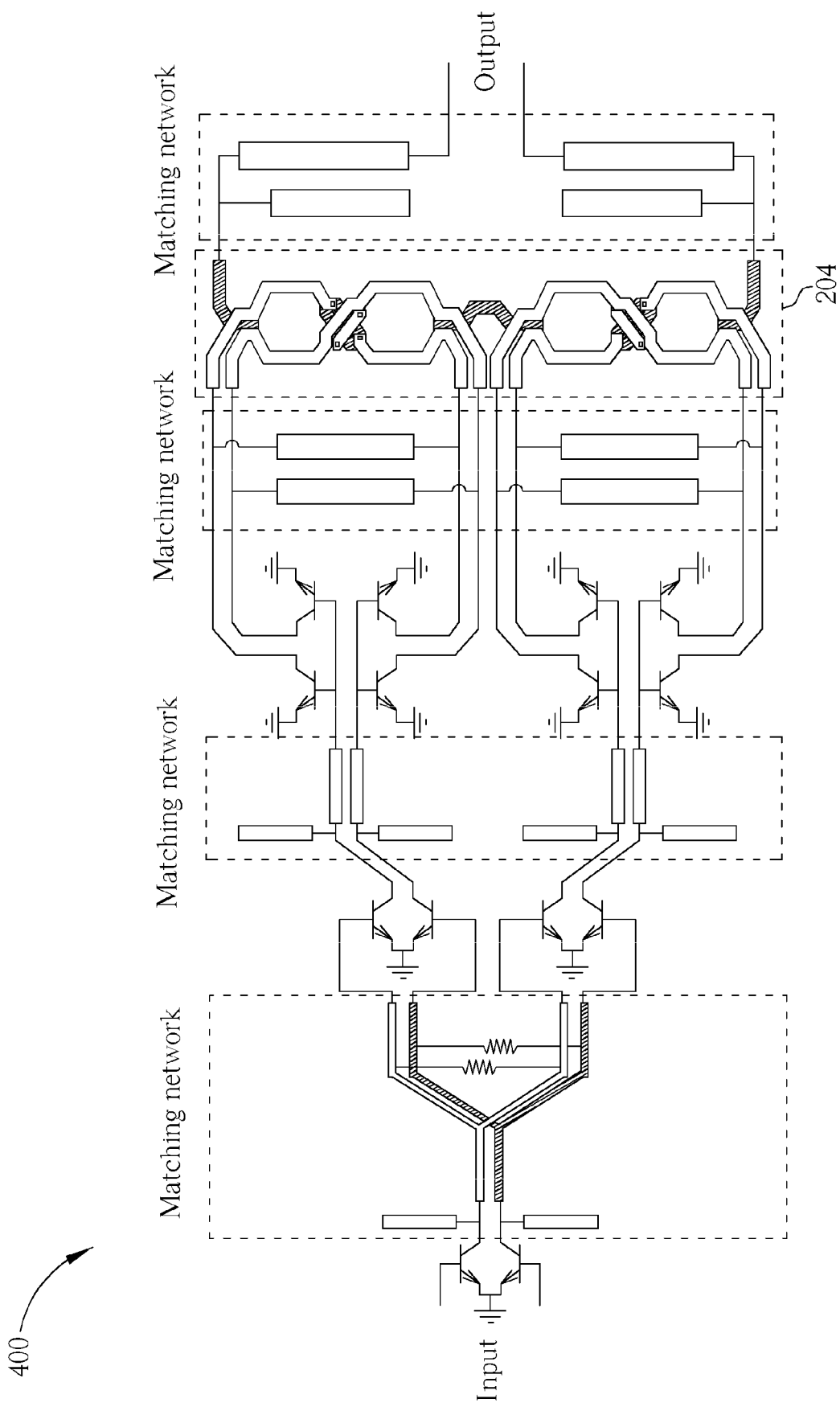
FIG. 4 shows an exemplary layout of a power amplifier system using BJT/HBT components and the power combiner with the layout shown in FIG. 3.
Figure 5:
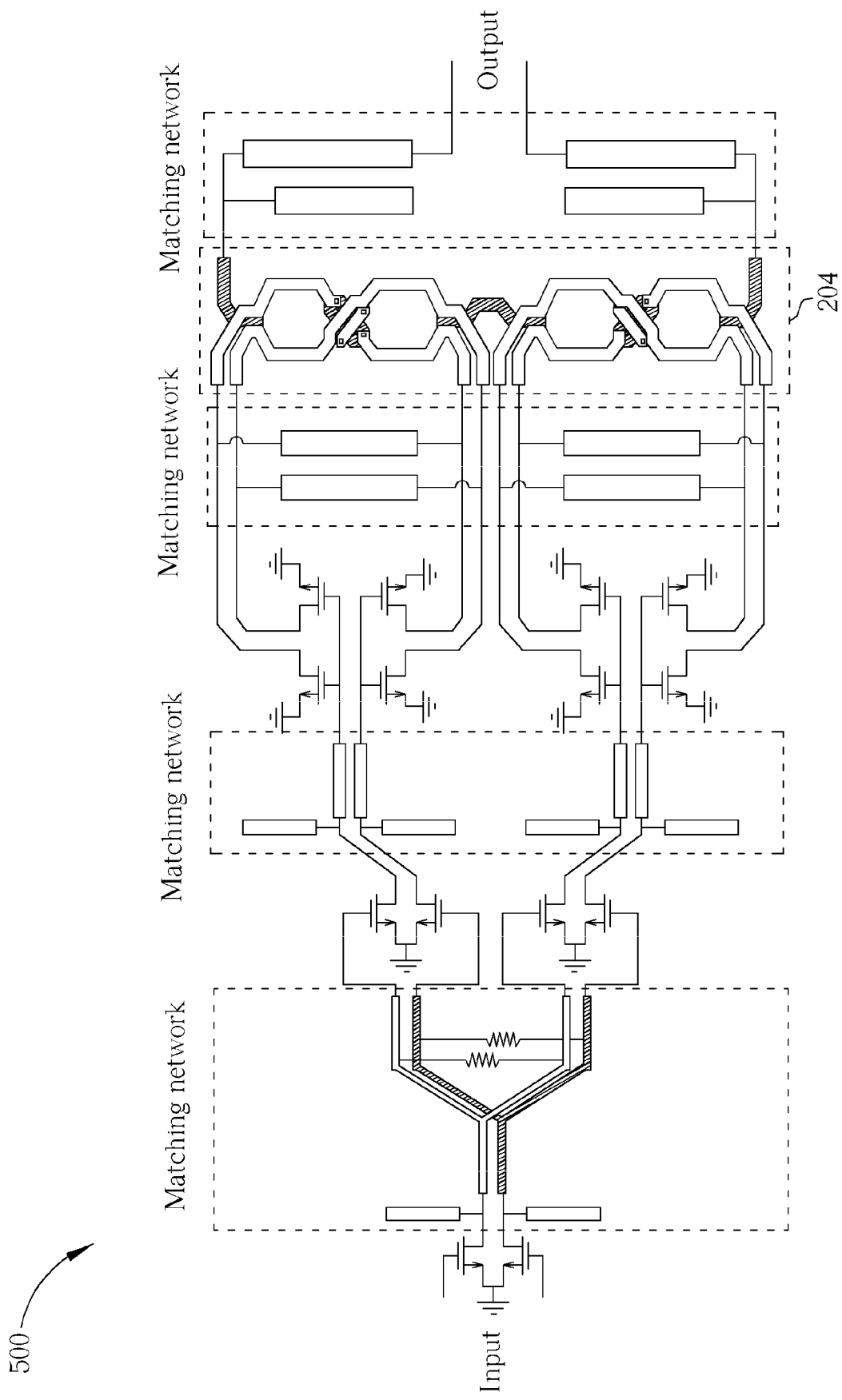
FIG. 5 shows another exemplary layout of a power amplifier system using FET components and the power combiner with the layout shown in FIG. 3.

Please refer to FIG. 3 in conjunction with FIG. 4 and FIG. 5. FIG. 4 shows an exemplary layout of a power amplifier system 400 using BJT/HBT components and the power combiner 204 with the layout shown in FIG. 3, and FIG. 5 shows another exemplary layout of a power amplifier system 500 using FET components and the power combiner 204 with the layout shown in FIG. 3. It should be noted that the power detector connections are omitted in the exemplary embodiments shown in FIG. 4 and FIG. 5. As clearly illustrated in FIG. 4 and FIG. 5, the overall transformer power combiner substantially has a symmetric layout. For example, a first projected pattern of the primary winding conductors (including the primary winding conductor composed of sections 301-303 and the primary winding conductor 314_2) and the secondary winding conductors (including the secondary winding conductor 316_1 and the secondary winding conductor composed of sections 304-306) on a plane parallel to either the first metal layer M1 or the second metal layer M2 is substantially symmetric, and a second projected pattern of the primary winding conductors (including the primary winding conductor 314_3 and the primary winding conductor composed of 310-312) and the secondary winding conductors (including the secondary winding conductor composed of sections 307-309 and the secondary winding conductor 316_4) on a plane parallel to either the first metal layer M1 or the second metal layer M2 is substantially symmetric. In addition, a partial layout of the transformer power combiner 204 on the first metal layer M1 is substantially symmetric (e.g., a layout pattern of the primary winding conductor 314_2 and sections 301, 302, 306 is a mirrored pattern of a layout pattern of the primary winding conductor 314_3 and sections 309, 310, 311), and a partial layout of the transformer power combiner 204 on the second metal layer M2 is also substantially symmetric (e.g., a layout pattern of the secondary winding conductor 316_1 and sections 303, 304, 305 is a mirrored pattern of a layout pattern of the secondary winding conductor 316_4 and sections 307, 308, 312). In this way, due to the well-defined substantially symmetric layout, the input impedance seen by each of the power amplifiers is substantially the same regardless of the coupling efficiency of the transformers implemented in the transformer power combiner. Furthermore, as the transformers in this exemplary embodiment are implemented using broadside design (e.g., one primary winding section and one secondary winding section overlapped in a direction perpendicular to the metal layer) and one-side coplanar design (e.g., adjacent primary and secondary winding sections routed on the same metal layer) according to the exemplary layout shown in FIG. 3, the transformer coupling efficiency is improved. In this way, the on-chip transformer power combiner configured using the circuit layout shown in FIG. 3 can achieve high transformer coupling efficiency and high power combining efficiency.

Figure 6:
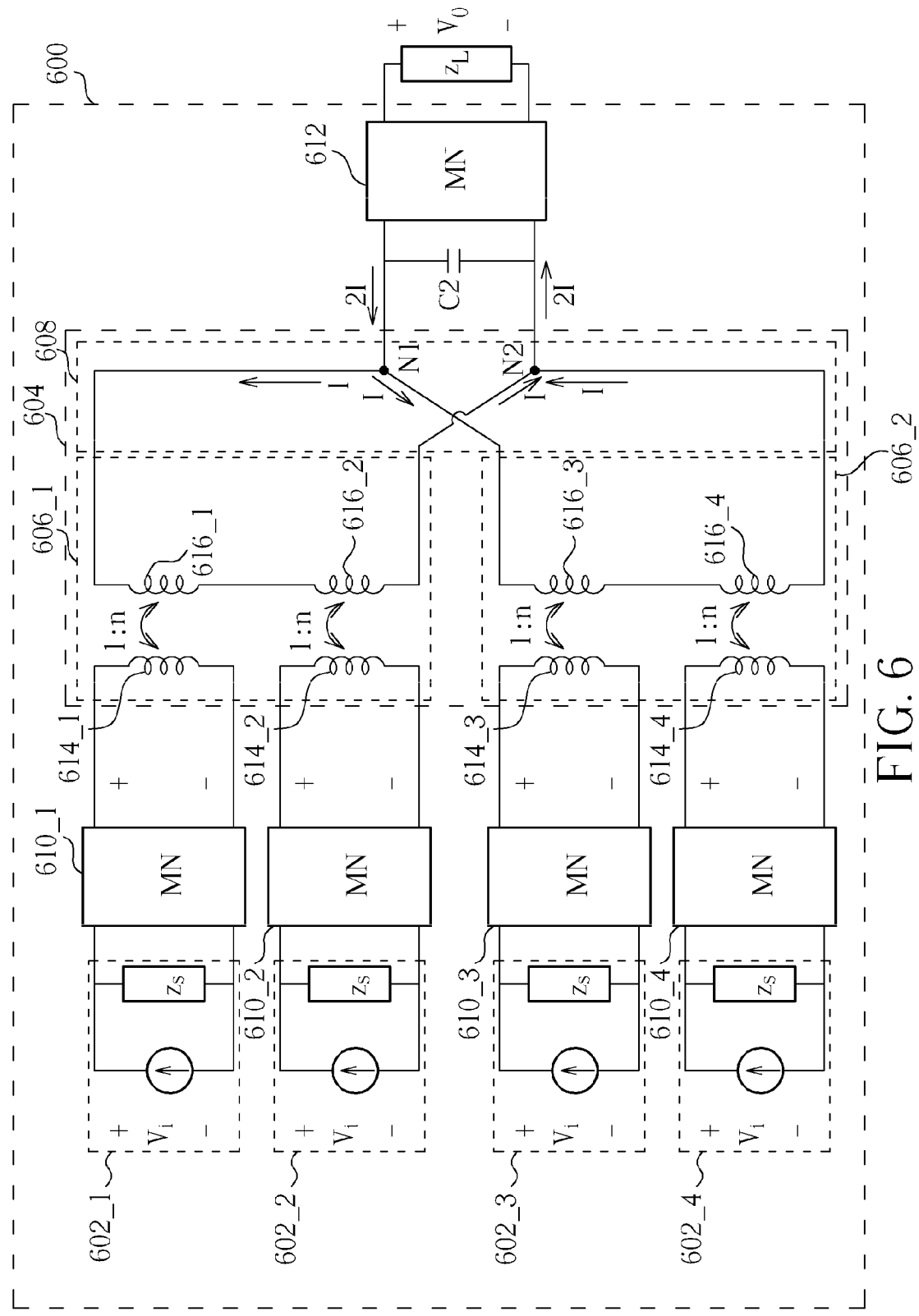
FIG. 6 is a schematic diagram illustrating a second exemplary embodiment of a power amplifier system according to the present invention.

FIG. 6 is a schematic diagram illustrating a second exemplary embodiment of a power amplifier system according to the present invention. The exemplary power amplifier system 600 includes a plurality of power amplifiers 602_1, 602_2, 602_3, 602_4 and a transformer power combiner 604. The transformer power combiner 604 has a plurality of input ports respectively coupled to the power amplifiers 602_1-602_4, and an output port coupled to an output load $Z_L$. The transformer power combiner 604 is configured to include a plurality of voltage combiners 606_1, 606_2 and a current combiner 608. The voltage combiners 606_1, 606_2 are formed by a plurality of primary winding conductors 614_1, 614_2, 614_3, 614_4 and a plurality of secondary winding conductors 616_1, 616_2, 616_3, 616_4. The voltage combiner 606_1 is configured to combine voltages across therein (e.g., the voltage across the secondary winding conductor 616_1 and the voltage across the secondary winding conductor 616_2); similarly, the voltage combiner 606_2 is configured to combine voltages across therein (e.g., the voltage across the secondary winding conductor 616_3 and the voltage across the secondary winding conductor 616_4). The current combiner 608 is configured to combine currents flowing through the voltage combiners 606_1 and 606_2 (e.g., 2I=I+ I), thereby generating an output $V_o$ at the output port of the transformer power combiner 604.

As shown in FIG. 6, the primary winding conductor 614_1 is electrically connected between a positive terminal (+) and a negative terminal (−) of a corresponding input port and is further magnetically coupled to the secondary winding conductor 616_1, the primary winding conductor 614_2 is electrically connected between a positive terminal (+) and a negative terminal (−) of a corresponding input port and is further magnetically coupled to the secondary winding conductor 616_2, the primary winding conductor 614_3 is electrically connected between a positive terminal (+) and a negative terminal (−) of a corresponding input port and is further magnetically coupled to the secondary winding conductor 616_3, and the primary winding conductor 614_4 is electrically connected between a positive terminal (+) and a negative terminal (−) of a corresponding input port and is further magnetically coupled to the secondary winding conductor 616_4. In addition, a plurality of matching networks (MNs) 610_1, 610_2, 610_3, 610_4, 612 are implemented in the power amplifier system 600 for impedance matching purposes. In this exemplary embodiment shown in FIG. 6, only four power amplifiers 602_1-602_4 are shown for illustrative purposes; however, this is not meant to be a limitation of the present invention. In other alternative designs obeying the spirit of the present invention are possible, the transformer power combiner can be implemented to combine power of more than four power amplifiers, depending upon design considerations.

Similar to the topology of the secondary winging conductors 216_1-216_4 shown in FIG. 2, the secondary winding conductors 616_1-616_4 in this exemplary embodiment shown in FIG. 6 are also configured in a topology including series connection and parallel connection between a positive terminal N1 and a negative terminal N2 of the output port; however, the secondary winding conductors 616_1 and 616_2 in this exemplary embodiment are connected in series between the positive terminal N1 and the negative terminal N2 of the output port, and the secondary winding conductors 616_3 and 616_4 in this exemplary embodiment are connected in series between the positive terminal N1 and the negative terminal N2 of the output port. As one can see, the series connection of the secondary winding conductors 616_1 and 616_2 and the series connection of the secondary winding conductors 616_3 and 616_4 are connected in parallel between the positive terminal N1 and the negative terminal N2 of the output port.

Provided that the turn ratio is 1:1, the input impedance seen by the power amplifier 602_1 is therefore determined by the secondary winding conductor 616_1 connected to the secondary winding conductor 616_2 in series and then further connected to a series connection of the secondary winding conductors 616_3 and 616_4 in parallel; similarly, the input impedance seen by the power amplifier 602_2 is therefore determined by the secondary winding conductor 616_2 connected to the secondary winding conductor 616_1 in series and then further connected to a series connection of the secondary winding conductors 616_3 and 616_4 in parallel, the input impedance seen by the power amplifier 602_3 is therefore determined by the secondary winding conductor 616_3 connected to the secondary winding conductor 616_4 in series and then further connected to a series connection of the secondary winding conductors 616_1 and 616_2 in parallel, and the input impedance seen by the power amplifier 602_4 is therefore determined by the secondary winding conductor 616_4 connected to the secondary winding conductor 616_3 in series and then further connected to a series connection of the secondary winding conductors 616_1 and 616_2 in parallel. It is appreciated that the input impedance seen by each of the power amplifiers 602_1-602_4 is the same due to the secondary winding conductors 616_1-616_4 connected through a novel topology including series connection and parallel connection between the positive terminal N1 and the negative terminal N2 of the output port. In this way, if the power amplifiers 602_1-602_4 are well-designed such that each power amplifier is modeled by the same RF current source and the same impedance $Z_S$, all of the input signals $V_i$ generated from the power amplifiers 602_1-602_4 would be synchronous with one another, resulting in synchronous amplitude/phase of the input current/voltage of the transformer power combiner 604.

Figure 7:
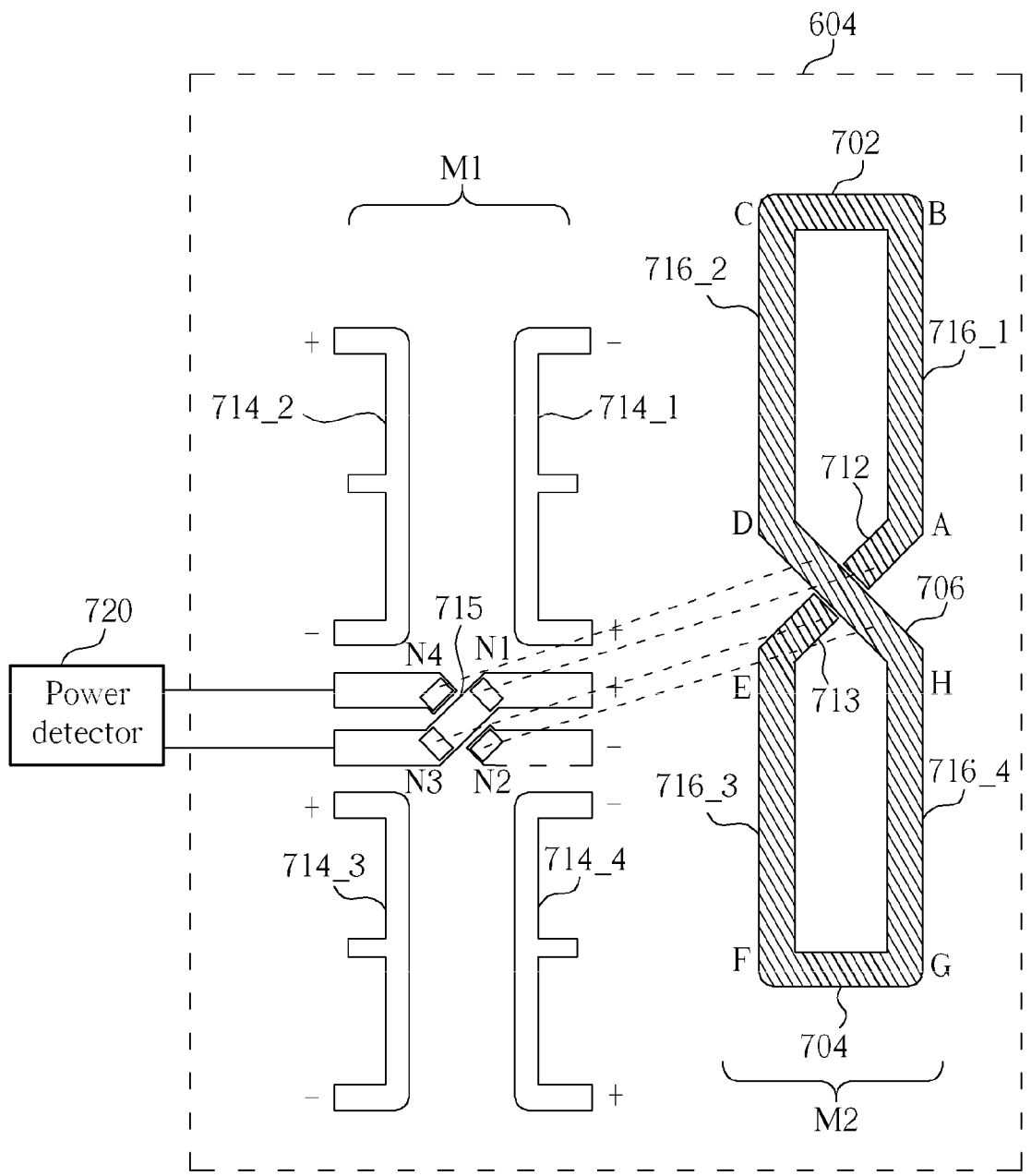
FIG. 7 is a diagram illustrating another exemplary layout of a transformer power combiner according to the present invention.

Based on the circuit configuration of the novel transformer power combiner 604 shown in FIG. 6, a layout of the on-chip transformer power combiner 604 should be well defined in an integrated circuit to achieve the desired objective of making the input impedance seen by each of the power amplifiers 602_1-602_4 substantially the same. Please refer to FIG. 7, which is a diagram illustrating another exemplary layout of a transformer power combiner according to the present invention. For example, in one implementation, the exemplary layout shown in FIG. 7 is to realize the transformer power combiner 604 in FIG. 6. Shown on the left side are conductive metal lines routed on a first metal layer M1, while shown on the right side are conductive metal lines routed on a second metal layer M2 different from the first metal layer M1. As mentioned above, the naming of the metal layers is not meant to limit the position relationship of the first and second metal layers M1 and M2. For example, in one implementation, the first metal layer M1 is configured to be disposed under the second metal layer M2; however, in another implementation, the first metal layer M1 could be alternatively disposed above the second metal layer M2. In short, the metal layers on which the primary and secondary winding conductors are routed depend upon design requirements. In addition, it should be noted that the layout design shown in FIG. 7 is for illustrative purposes only, and is not meant to be a limitation of the present invention. That is to say, other alternative layout designs obeying the spirit of the present invention still fall within the scope of the present invention.

In this embodiment using the layout in FIG. 7 to realize the transformer power combiner 604 in FIG. 6, the primary winding conductors 614_1-614_4 and the secondary winding conductors 616_1-616_4 in FIG. 6 are therefore implemented using primary winding conductors 714_1-714_4 and the secondary winding conductors 716_1-716_4 in FIG. 7, respectively. As clearly illustrated in FIG. 7, the primary winding conductors 714_1-714_4 are routed on the first metal layer M1 of the integrated circuit symmetrically, and the secondary winding conductors 716_1-716_4 are also routed on the second metal layer M2 of the integrated circuit symmetrically. In this exemplary embodiment, the first secondary winding conductor 716_1 (between nodes A and B) and the second secondary winding conductor 716_2 (between nodes C and D) are electrically connected by a first conductor 702 routed between nodes B and C on the second metal layer M2; the third secondary winding conductor 716_3 (between nodes E and F) and the fourth secondary winding conductor 716_4 (between nodes H and G) are electrically connected by a second conductor 704 routed between nodes F and G on the second metal layer M2; the second secondary winding conductor 716_2 and the fourth secondary winding conductor 716_4 are electrically connected by a third conductor 706 routed between nodes D and H on the second metal layer M2; and the first secondary winding conductor 716_1 and the third secondary winding conductor 716_3 are electrically connected by a fourth conductor electrically connected between nodes A and E, where the fourth conductor has a first section 712 and a second section 713 routed on the second metal layer M2, and a third section 715 routed on the first metal layer M1, and the first section 712, the second section 713, and the third section 715 are electrically connected through vias represented by broken lines shown in FIG. 7. Furthermore, the positive terminal N1 is electrically connected to the first section 712 through a via, and the negative terminal N2 is electrically connected to the third conductor 706 through a via. A projected pattern of the third section 715 on the second metal layer M2 intersects the third conductor 706, which is more clearly shown in following figures.

In addition, two connecting nodes N3 and N4 shown in FIG. 7 could be optionally formed and coupled to a power detector 720 used for detecting power at the output port of the transformer power combiner 604. Based on the power detection result, other circuits therefore can adjust the power of the power amplifiers 602_1-602_4 connected to input ports of the transformer power combiner 604. In this exemplary embodiment, as the connecting node N4 is electrically connected to the third conductor 706 through a via, the connecting node N4 is therefore electrically connected to the negative terminal N2. Regarding the connecting node N3, it is electrically connected to the positive terminal N1 through the third section 715. In this way, the voltage levels at the connecting nodes N1 and N2 can be successfully monitored by the power detector 720 that is coupled to the connecting nodes N3 and N4. However, it should be noted that such a power detector configuration is optional. That is, in other embodiments, the power detector 720 could be omitted according to actual design requirements. When the power detector 720 is not implemented due to design considerations, the connecting nodes N3 and N4, related vias electrically connected to the connecting nodes N3 and N4, and the signal traces routed between the connecting nodes N3 and N4 and the power detector 720 could be omitted accordingly.

Figure 8:
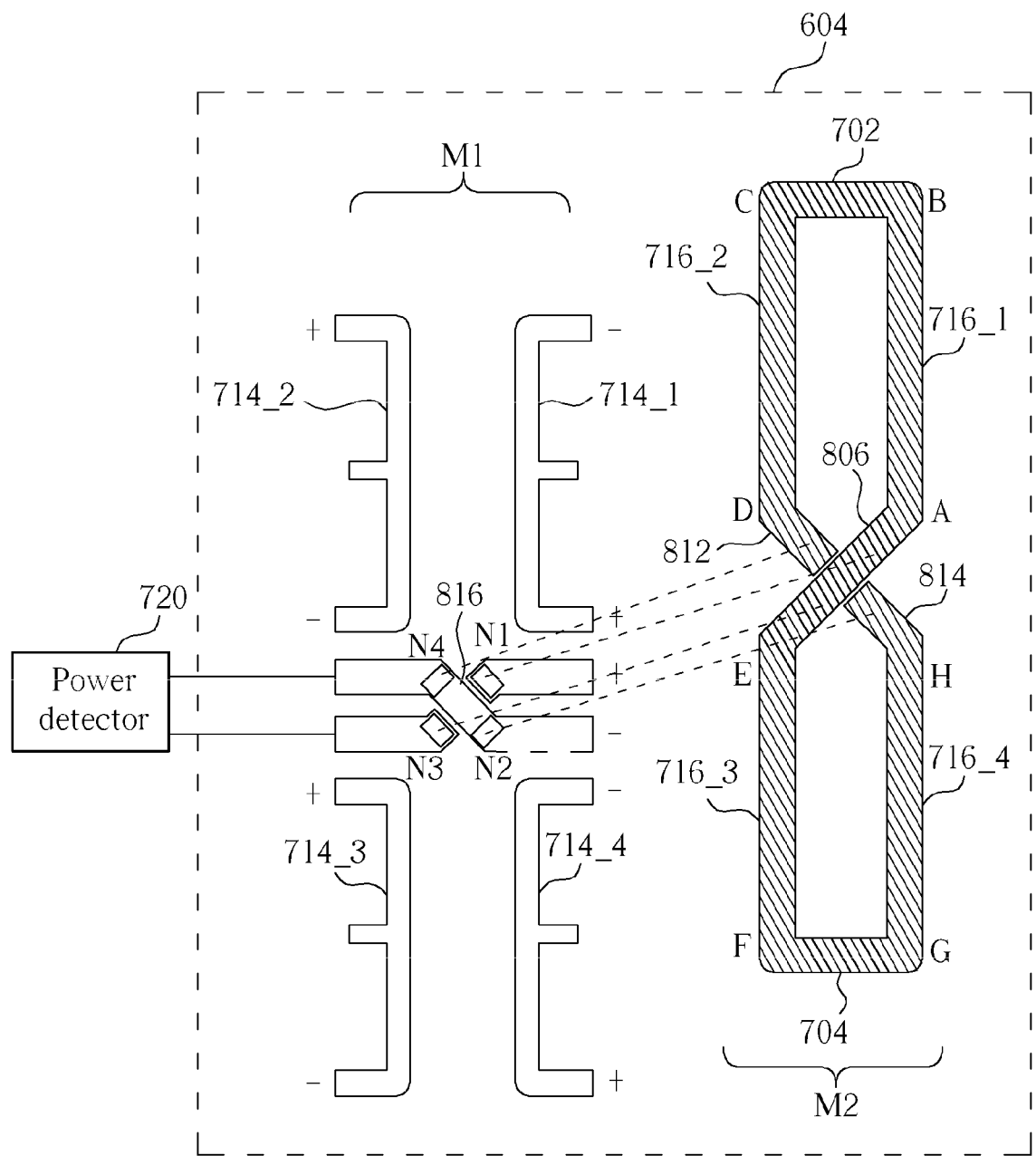
FIG. 8 is a diagram illustrating yet another exemplary layout of a transformer power combiner according to the present invention.

The layout shown in FIG. 7 is for illustrative purposes. Other alternative designs obeying the spirit of the invention are possible. Please refer to FIG. 8, which a diagram illustrating yet another exemplary layout of a transformer power combiner according to the present invention. For example, the exemplary layout shown in FIG. 8 is an alternative exemplary layout of the transformer power combiner 604 shown in FIG. 6. The layout shown in FIG. 8 is similar to that shown in FIG. 7. The difference is the connection configuration of nodes A, D, E, and H. As shown in FIG. 8, the first secondary winding conductor 716_1 and the third secondary winding conductor 716_3 are electrically connected by a third conductor 806 routed between nodes A and E on the second metal layer M2, and the second secondary winding conductor 716_2 and the fourth secondary winding conductor 716_4 are electrically connected by a fourth conductor electrically connected between nodes D and H, where the fourth conductor has a first section 812 and a second section 814 routed on the second metal layer M2, and a third section 816 routed on the first metal layer M1. In addition, the first section 812, the second section 814, and the third section 816 are electrically connected through vias represented by broken lines shown in FIG. 8. In this embodiment, the positive terminal N1 is electrically connected to the third conductor 806 through a via, and the negative terminal N2 is electrically connected to the second section 814 through a via. Furthermore, a projected pattern of the third section 816 on the second metal layer M2 intersects the third conductor 806. As a person skilled in the art would readily understand layout of the remaining portions in FIG. 8 after reading above disclosure directed to the layout shown in FIG. 7, further description is omitted here for brevity.

Figure 9:
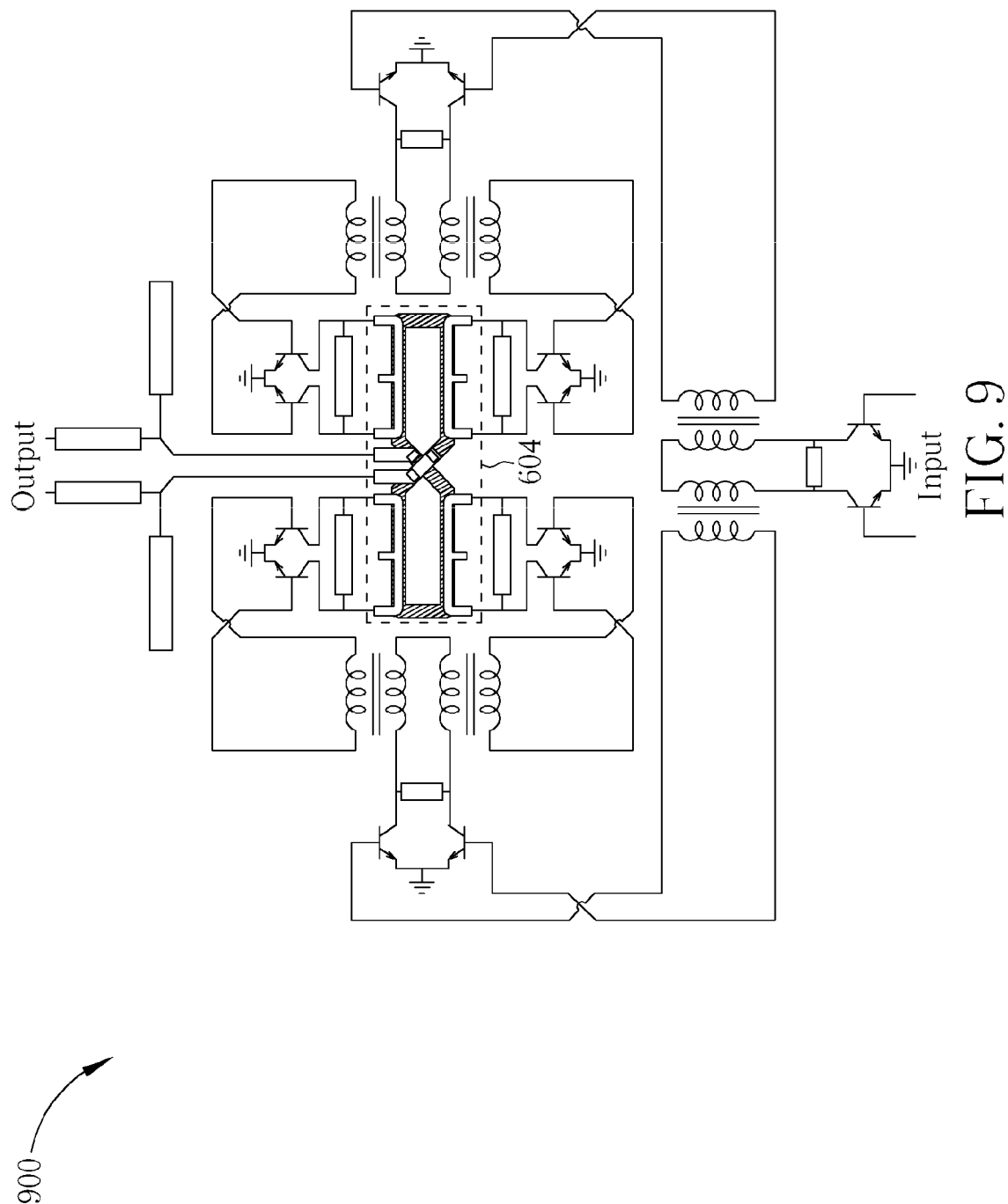
FIG. 9 shows an exemplary layout of a power amplifier system using BJT/HBT components and the power combiner with the layout shown in FIG. 7.
Figure 10:
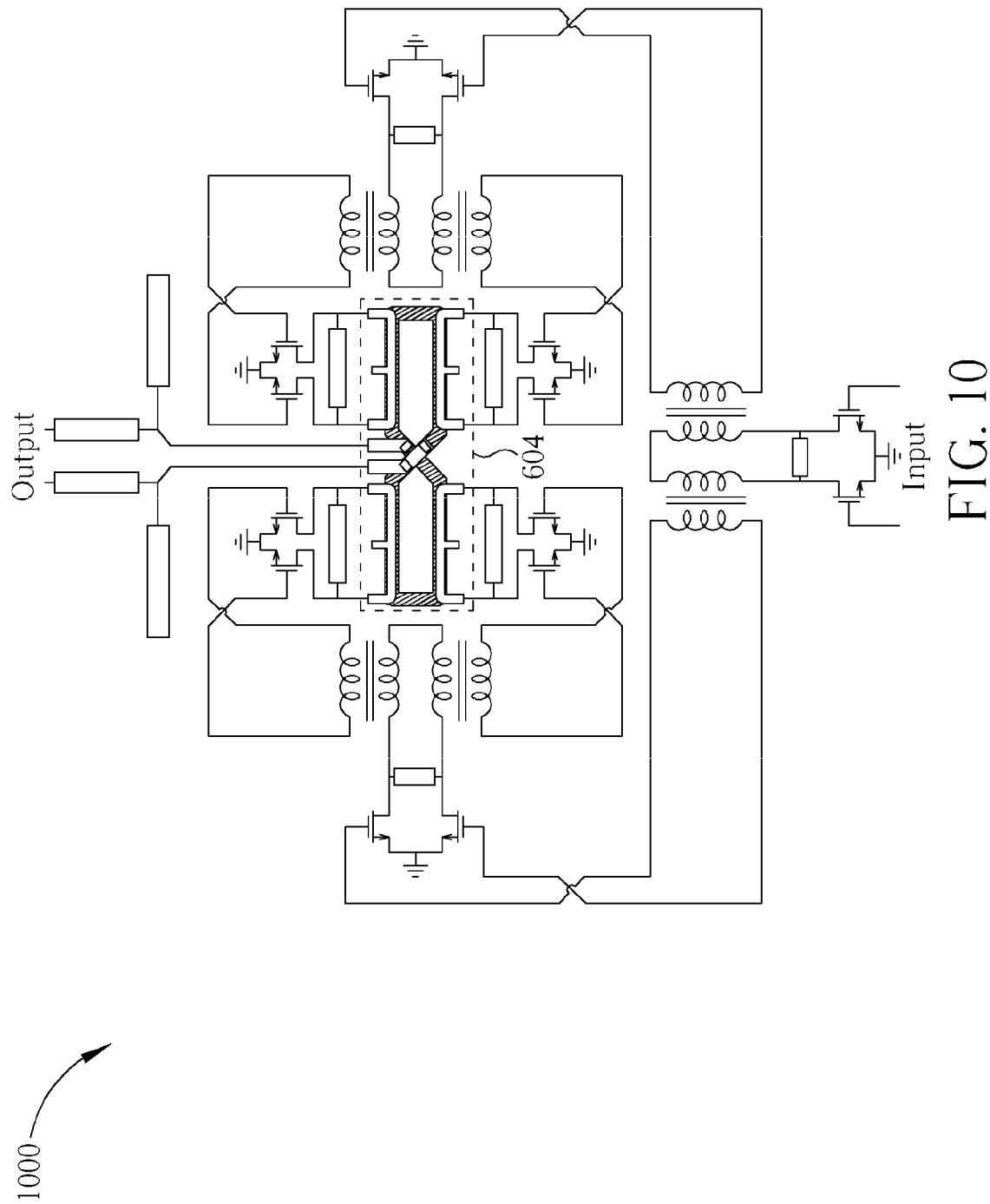
FIG. 10 shows another exemplary layout of a power amplifier system using FET components and the power combiner with the layout shown in FIG. 7.

Please refer to FIG. 7 in conjunction with FIG. 9 and FIG. 10. FIG. 9 shows an exemplary layout of a power amplifier system 900 using BJT/HBT components and the power combiner 604 in FIG. 7, and FIG. 10 shows another exemplary layout of a power amplifier system 1000 using FET components and the power combiner 604 in FIG. 7. It should be noted that the power detector connections are omitted in the exemplary embodiments shown in FIG. 9 and FIG. 10. As clearly illustrated in FIG. 9 and FIG. 10, the overall transformer power combiner substantially has a symmetric layout. That is, as illustrated in FIG. 7 and FIG. 8, the primary winding conductors 714_1-714_4 are symmetrically routed on the first metal layer M1, and the secondary winding conductors 716_1-716_4 are symmetrically routed on the second metal layer M2. In this way, due to the well-defined substantially symmetric layout, the input impedance seen by each of the power amplifier is substantially the same regardless of the coupling efficiency of the transformers implemented in the transformer power combiner. Furthermore, as the transformers in this exemplary embodiment are implemented using a broadside design according to the exemplary layouts shown in FIG. 7 and FIG. 8, the transformer coupling efficiency is improved. In this way, the on-chip transformer power combiner configured using the circuit layouts shown in FIG. 7 or FIG. 8 can achieve high transformer coupling efficiency and high power combining efficiency.

In addition, the present invention further proposes a novel load impedance optimization technique detailed hereinafter. Please refer to the exemplary embodiment shown in FIG. 2 again. An optional capacitive component (e.g., a capacitor C1) could be electrically connected between the positive terminal N1 and the negative terminal N2 of the output port for tuning the load impedance seen by the power amplifiers. As the transformer generally include parasitic inductors, the capacitor C1 is therefore implemented for resonating the transformer inductance to alleviate the effect caused by parasitic inductors, thereby properly tuning load impedance toward a desired value. Similarly, as shown in the other exemplary embodiment in FIG. 6, an optional capacitive component (e.g., a capacitor C2) could be electrically connected between the positive terminal N1 and the negative terminal N2 of the output port for tuning the load impedance. In view of the layout designs shown in FIG. 7 and FIG. 8, as connecting nodes N3 and N4 are electrically connected to the positive and negative terminals N1 and N2 respectively, the capacitor C2 in FIG. 6 could be connected between N1 and N4, or between N2 and N3; in addition, provided that the optional power detector 720 is not implemented in the system, the capacitor C2 in FIG. 6 is allowed to be connected between N3 and N4.

Furthermore, with proper design of the power detectors 320, 720, the power detectors 320, 720 not only can be arranged to detect output power at the output port of the transformer power combiner, but also can be used to tune the load impedance. That is, in addition to detecting output power, the power detector 720 implemented in the communication system is further configured to have a capacitive characteristic seen between the positive terminal N1 and the negative terminal N2 of the output port to thereby tune the load impedance. In this case where the power detector 720 is further used for load impedance optimization, the capacitive components (i.e., the capacitor C2 shown in FIG. 6) thus could be omitted. Following the same conception mentioned above, the layout of the transformer power combiner 204 in FIG. 3 can be modified to have a capacitor or power detector connected between the positive terminal N1 and the negative terminal N2 for tuning the load impedance. In addition, provided that the layout symmetry is retained, the layout shown in FIG. 3 could be properly modified to shorten the distance between the positive terminal N1 and the negative terminal N2 for reducing the layout complexity of the capacitor or power detector connection. For example, the top-right portion shown in FIG. 3 can be bent clockwise with respect to the connecting node N3, and the bottom-right portion shown in FIG. 3 can be bent counterclockwise with respect to the connecting node N3, whereby the distance between the positive terminal N1 and the negative terminal N2 is shortened. In order to keep the overall layout symmetric, the partial layout of the transformer power combiner 204 on the first metal layer M1 is properly bent in response to the aforementioned modification made to the partial layout of the transformer power combiner 204 on the second metal layer M2.

The fully synchronous transformer power combiners of the above embodiments are compatible to all classes (e.g., class A, class AB, etc.) of the power amplifier, and therefore can be employed in a variety of application fields. Moreover, the power combining performance of the transformer power combiners of the above embodiments are independent of the transformer design for all frequency bands. In other words, the transformer power combiner of the above embodiments can be not limited to only the high-frequency applications, such as mmWave applications.

By way of example, but not limitation, the aforementioned power combiner 204/604 may be modified to serve as a power splitter by applying an input signal to the originally defined power combiner output port (which becomes a power splitter input port while the power combiner 204/604 is arranged to serve as a power splitter in this example). Output signals will appear at originally defined multiple power combiner input ports (which become power splitter output ports while the power combiner 204/604 is arranged to serve as a power splitter in this example), respectively. With the proposed innovative circuit structure employed in the power splitter, two design parameters, transformer efficiency and power splitting efficiency, therefore can be unbound. Further description is detailed as follows.

Figure 11:
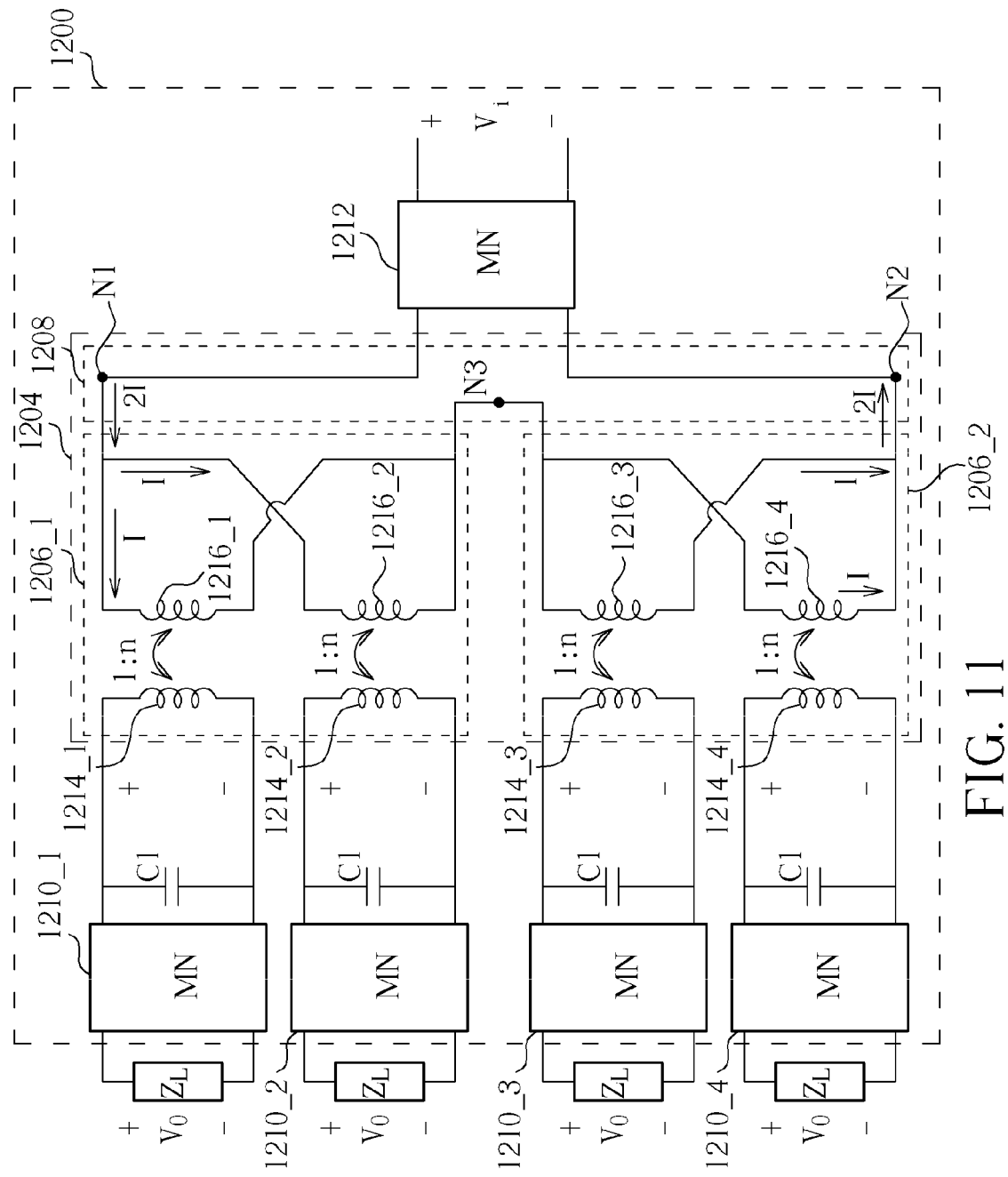
FIG. 11 is a schematic diagram illustrating a first exemplary embodiment of a power splitting system according to the present invention.

FIG. 11 is a schematic diagram illustrating a first exemplary embodiment of a power splitting system according to the present invention. The exemplary power splitting system 1200 includes a transformer power splitter 1204 having an input port for receiving an input $V_i$ and a plurality of output ports respectively coupled to output loads $Z_L$. The transformer power splitter 1204 is configured to include current splitters 1206_1 and 1206_2 formed by a plurality of secondary winding conductors 1214_1, 1214_2, 1214_3, 1214_4 and a plurality of primary winding conductors 1216_1, 1216_2, 1216_3, 1216_4; in addition, the transformer power splitter 1204 also includes a voltage splitter 1208. Each of the current splitters 1206_1 and 1206_2 is configured to split a current flowing thereto (e.g., 2I=I+I), and the voltage splitter 208 is configured to split a voltage across two ends thereof into voltages across the series-connected current splitters (e.g., the voltage between N1 and N2 is split into the voltage between N1 and N3 and the voltage between N3 and N2). In this way, the input $V_i$ at the input port is split into a plurality of outputs $V_o$ at the output ports.

As shown in FIG. 11, the secondary winding conductor 1214_1 is electrically connected between a positive terminal (+) and a negative terminal (−) of a corresponding output port and is further magnetically coupled to the primary winding conductor 1216_1, the secondary winding conductor 1214_2 is electrically connected between a positive terminal (+) and a negative terminal (−) of a corresponding output port and is further magnetically coupled to the primary winding conductor 1216_2, the secondary winding conductor 1214_3 is electrically connected between a positive terminal (+) and a negative terminal (−) of a corresponding output port and is further magnetically coupled to the primary winding conductor 1216_3, and the secondary winding conductor 1214_4 is electrically connected between a positive terminal (+) and a negative terminal (−) of a corresponding output port and is further magnetically coupled to the primary winding conductor 1216_4. In addition, a plurality of matching networks (MNs) 1210_1, 1210_2, 1210_3, 1210_4, 1212 are also implemented in the power splitting system 1200 for impedance matching purposes. As the implementation of the matching networks is well known to those skilled in the art, further description is omitted here for brevity. In this exemplary embodiment shown in FIG. 11, only four output ports are shown for illustrative purposes; however, this is not meant to be a limitation of the present invention. In other alternative designs obeying the spirit of the present invention, the transformer power splitter can be implemented for splitting the input power of an input signal and accordingly generating more than four output signals, depending upon design considerations.

As shown in FIG. 11, the primary winding conductors 1216_1-1216_4 in the exemplary embodiment shown in FIG. 11 are configured in a topology including series connection and parallel connection between a positive terminal N1 and a negative terminal N2 of the input port of the transformer power splitter 1204. More specifically, the primary winding conductors 1216_1 and 1216_2 are connected in parallel between the positive terminal N1 of the input port and a connecting node N3, and the primary winding conductors 1216_3 and 1216_4 are connected in parallel between the connecting node N3 and the negative terminal N2 of the input port. Provided that the turn ratio is 1:1, the output impedance viewed from the output port coupled to the secondary winding conductor 1214_1 is therefore determined by the primary winding conductor 1216_1 connected to the primary winding conductor 1216_2 in parallel and then further connected to a parallel connection of the primary winding conductors 1216_3 and 1216_4 in series; similarly, the output impedance viewed from the output port coupled to the secondary winding conductor 1214_2 is therefore determined by the primary winding conductor 1216_2 connected to the primary winding conductor 1216_1 in parallel and then further connected to a parallel connection of the primary winding conductors 1216_3 and 1216_4 in series, the output impedance viewed from the output port coupled to the secondary winding conductor 1214_3 is therefore determined by the primary winding conductor 1216_3 connected to the primary winding conductor 1216_4 in parallel and then further connected to a parallel connection of the primary winding conductors 1216_1 and 1216_2 in series, and the output impedance viewed from the output port coupled to the secondary winding conductor 1214_4 is therefore determined by the primary winding conductor 1216_4 connected to the primary winding conductor 1216_3 in parallel and then further connected to a parallel connection of the primary winding conductors 1216_1 and 1216_2 in series. Thus, the output impedance at the output ports is the same due to the primary winding conductors 1216_1-1216_4 connected through a novel topology including series connection and parallel connection between the positive terminal N1 and the negative terminal N2 of the input port. In this way, the input power $P_i$ of the input $V_i$ is evenly split, thereby generating four output signals each having the same output power $P_o$ (e.g., $$P_o = \frac{1}{4} P_i$$

in this exemplary embodiment).

Figure 12:
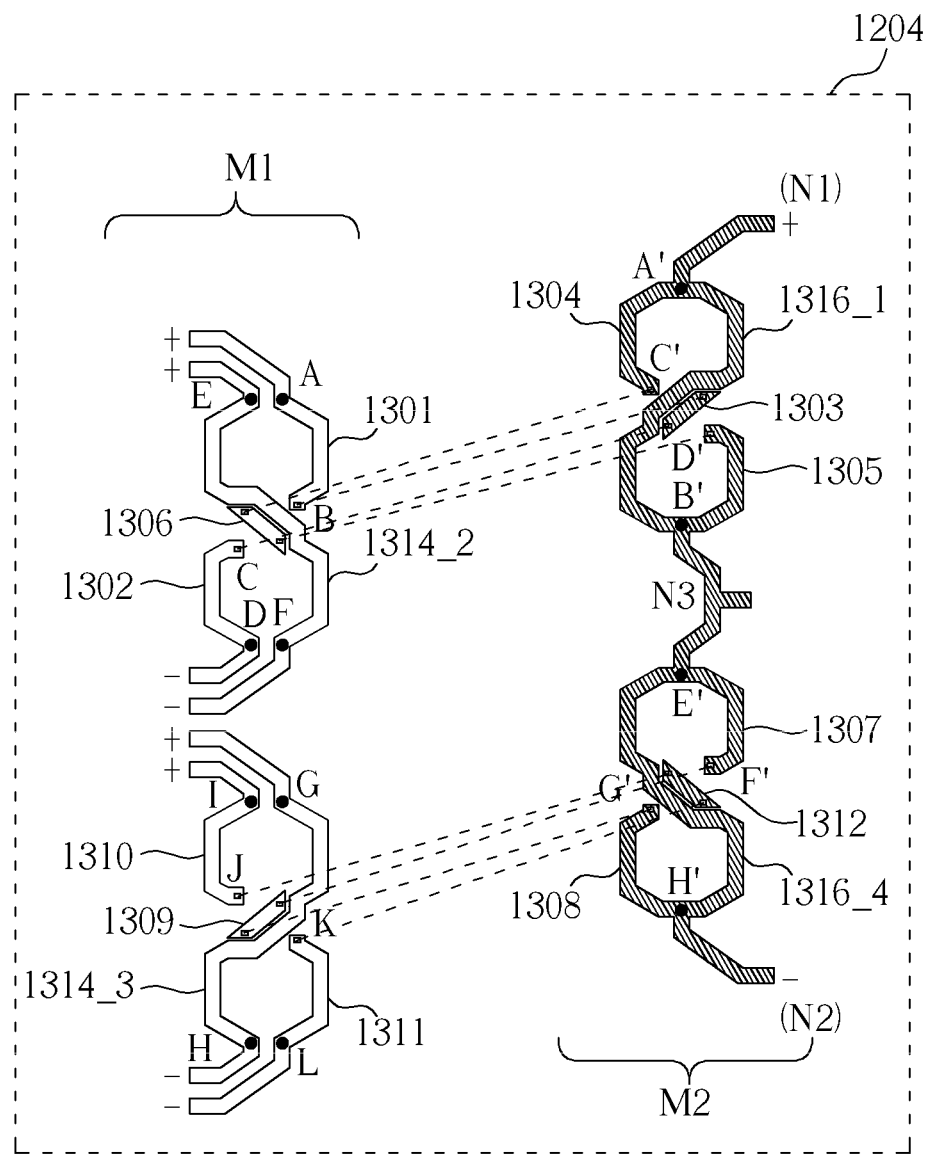
FIG. 12 is a diagram illustrating an exemplary layout of a transformer power splitter according to the present invention.

Based on the configuration of the novel transformer power splitter 1204 shown in FIG. 11, a layout of the on-chip transformer power splitter 1204 should be well defined in an integrated circuit to achieve the desired objective of making the output impedance viewed from the output ports substantially the same. Please refer to FIG. 12, which is a diagram illustrating an exemplary layout of a transformer power splitter according to the present invention. For example, in one implementation, the exemplary layout shown in FIG. 12 is designed to realize the transformer power splitter 1204 in FIG. 11. Shown on the left side are conductive metal lines routed on a first metal layer M1, while shown on the right side are conductive metal lines routed on a second metal layer M2 different from the first metal layer M1. Please note that the naming of the metal layers is not meant to limit the position relationship of the first and second metal layers. For example, in one implementation, the first metal layer is configured to be disposed under the second metal layer; however, in another implementation, the first metal layer could be alternatively disposed above the second metal layer. In short, the metal layers on which the primary and secondary winding conductors are routed depend upon design requirements. In addition, it should be noted that the layout design shown in FIG. 12 is for illustrative purposes only, and is not meant to be a limitation of the present invention. That is to say, other alternative layout designs obeying the spirit of the present invention still fall within the scope of the present invention.

As clearly illustrated in FIG. 12, a partial layout of the transformer power splitter 1204 on the first metal layer M1 is substantially symmetric, and a partial layout of the transformer power splitter 1204 on the second metal layer M2 is substantially symmetric as well. In this exemplary embodiment, a secondary winding conductor, which is used for implementing the secondary winding conductor 1214_1 in FIG. 11, includes a first section 1301 (between nodes A and B) and a second section 1302 (between nodes C and D) routed on the first metal layer M1, and a third section 1303 routed on the second metal layer M2 and interconnecting the first section 1301 and the second section 1302 through vias represented by broken lines illustrated in FIG. 12; a primary winding conductor 1316_1, which is used for implementing the primary winding conductor 1216_1 in FIG. 11 and corresponds to the secondary winding conductor used for implementing the secondary winding conductor 1214_1 in FIG. 11, is routed on the second metal layer between nodes A' and B', where node A' is electrically connected to the positive terminal N1 of the input port and node B' is electrically connected to the connecting node N3. A secondary winding conductor 1314_2 used for implementing the secondary winding conductor 1214_2 in FIG. 11 is routed on the first metal layer M1 between nodes E and F. A projected pattern of the third section 1303 on the first metal layer M1 intersects the secondary winding conductor 1314_2, which is more clearly shown in the following figure. A primary winding conductor, which is used for implementing the primary winding conductor 1216_2 in FIG. 11 and corresponds to the secondary winding conductor 1314_2, has a first section 1304 (between nodes A' and C') and a second section 1305 (between nodes D' and B') routed on the second metal layer M2, and a third section 1306 routed on the first metal layer M1 and interconnecting the first section 1304 and the second section 1305 through vias represented by broken lines. A projected pattern of the third section 1306 on the second metal layer M2 intersects the primary winding conductor 1316_1, which is more clearly shown in the following figure.

A secondary winding conductor 1314_3, which is used for implementing the secondary winding conductor 1214_3 in FIG. 11, is routed on the first metal layer M1 between nodes G and H; a primary winding conductor, which is used for implementing the primary winding conductor 1216_3 in FIG. 11 and corresponds to the secondary winding conductor 1314_3, has a first section 1307 (between nodes E' and F') and a second section 1308 (between nodes G' and H') routed on the second metal layer M2, and a third section 1309 routed on the first metal layer M1 and interconnecting the first section 1307 and the second section 1308 through vias represented by broken lines. A secondary winding conductor used for implementing the secondary winding conductor 1214_4 in FIG. 11 has a first section 1310 (between nodes I and J) and a second section 1311 (between nodes K and L) routed on the first metal layer M1, and a third section 1312 routed on the second metal layer M2 and interconnecting the first section 1310 and the second section 1311 through vias represented by broken lines. A projected pattern of the third section 1312 on the first metal layer M1 intersects the primary winding conductor 1314_3, which is more clearly shown in the following figure. A primary winding conductor 1316_4, which is used for implementing the primary winding conductor 1216_4 in FIG. 11, is routed between nodes E' and H' on the second metal layer M2. As one can see from the figure, node E' is electrically connected to the connecting node N3, and node H' is electrically connected to the negative terminal N2 of the input port; in addition, a projected pattern of the third section 1309 on the second metal layer M2 intersects the primary winding conductor 1316_4, which is more clearly shown in the following figure.

Figure 13:
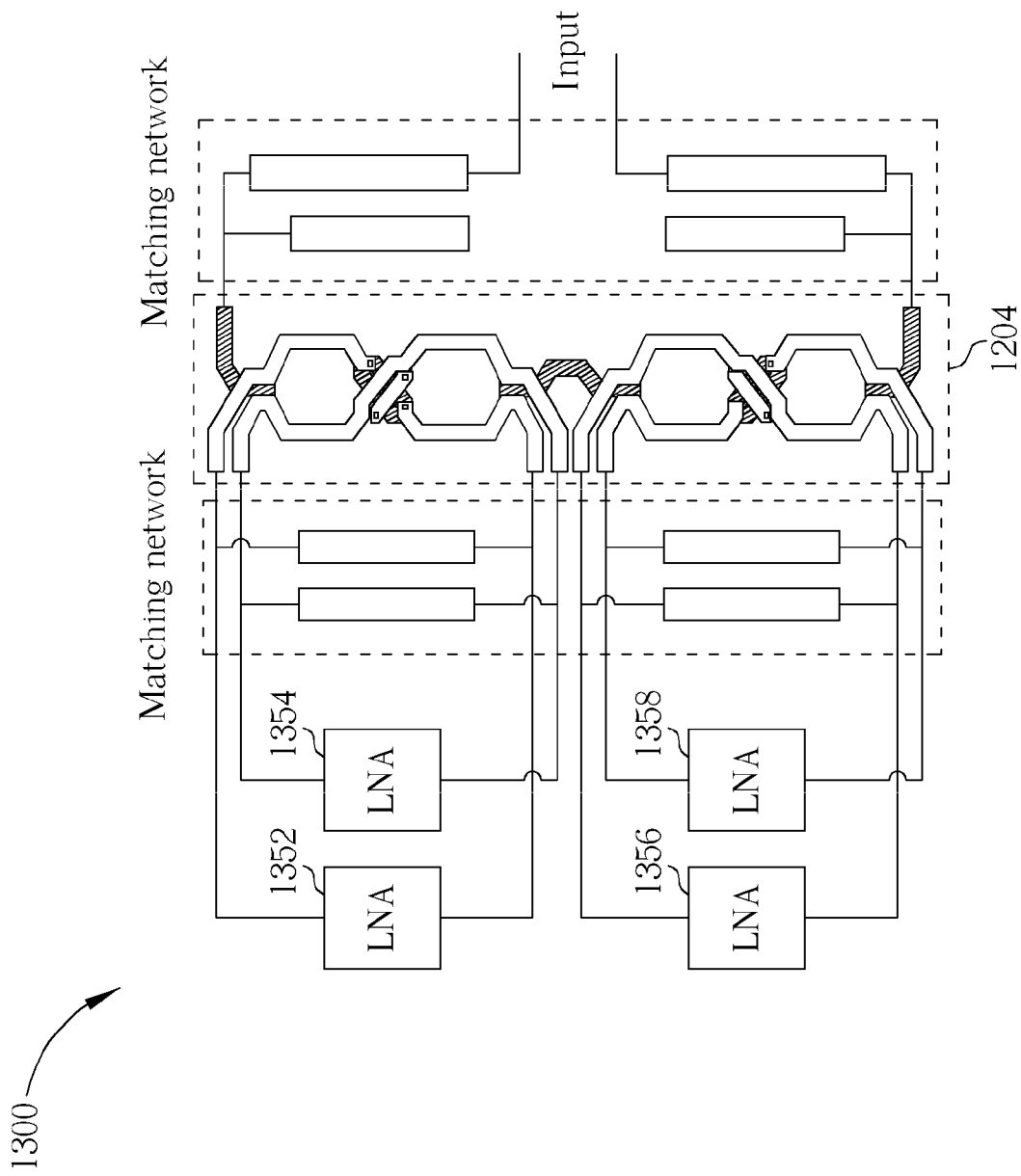
FIG. 13 shows an exemplary implementation of a power splitting system using the power splitter with the layout shown in FIG. 11.

Please refer to FIG. 12 in conjunction with FIG. 13. FIG. 13 shows an exemplary implementation of a power splitting system 1300 using the power splitter 1204 with the layout shown in FIG. 11. The power splitting system 1300 may be a receiver front-end for receiving the input signal from an antenna, and splitting the input power of the input signal to thereby generate a plurality of output signals to a plurality of low-noise amplifiers (LNAs) 1352, 1354, 1356, 1358, respectively. As clearly illustrated in FIG. 13, the overall transformer power splitter substantially has a symmetric layout. For example, a first projected pattern of the secondary winding conductors (including the secondary winding conductor composed of sections 1301-1303 and the secondary winding conductor 1314_2) and the primary winding conductors (including the primary winding conductor 1316_1 and the primary winding conductor composed of sections 1304-1306) on a plane parallel to either the first metal layer M1 or the second metal layer M2 is substantially symmetric, and a second projected pattern of the secondary winding conductors (including the secondary winding conductor 1314_3 and the secondary winding conductor composed of sections 1310-1312) and the primary winding conductors (including the primary winding conductor composed of sections 1307-1309 and the primary winding conductor 1316_4) on a plane parallel to either the first metal layer M1 or the second metal layer M2 is substantially symmetric. In addition, a partial layout of the transformer power splitter 1204 on the first metal layer M1 is substantially symmetric (e.g., a layout pattern of the secondary winding conductor 1314_2 and sections 1301, 1302, 1306 is a mirrored pattern of a layout pattern of the secondary winding conductor 1314_3 and sections 1309, 1310, 1311), and a partial layout of the transformer power splitter 1204 on the second metal layer M2 is also substantially symmetric (e.g., a layout pattern of the primary winding conductor 1316_1 and sections 1303, 1304, 1305 is a mirrored pattern of a layout pattern of the primary winding conductor 1316_4 and sections 1307, 1308, 1312). In this way, due to the well-defined substantially symmetric layout, the output impedance viewed from the output ports is substantially the same regardless of the coupling efficiency of the transformers implemented in the transformer power splitter. Furthermore, as the transformers in this exemplary embodiment are implemented using broadside design (e.g., one primary winding section and one secondary winding section overlapped in a direction perpendicular to the metal layer) and one-side coplanar design (e.g., adjacent primary and secondary winding sections routed on the same metal layer) according to the exemplary layout shown in FIG. 12, the transformer coupling efficiency is improved. In this way, the on-chip transformer power splitter configured using the circuit layout shown in FIG. 12 can achieve high transformer coupling efficiency and high power splitting efficiency.

Figure 14:
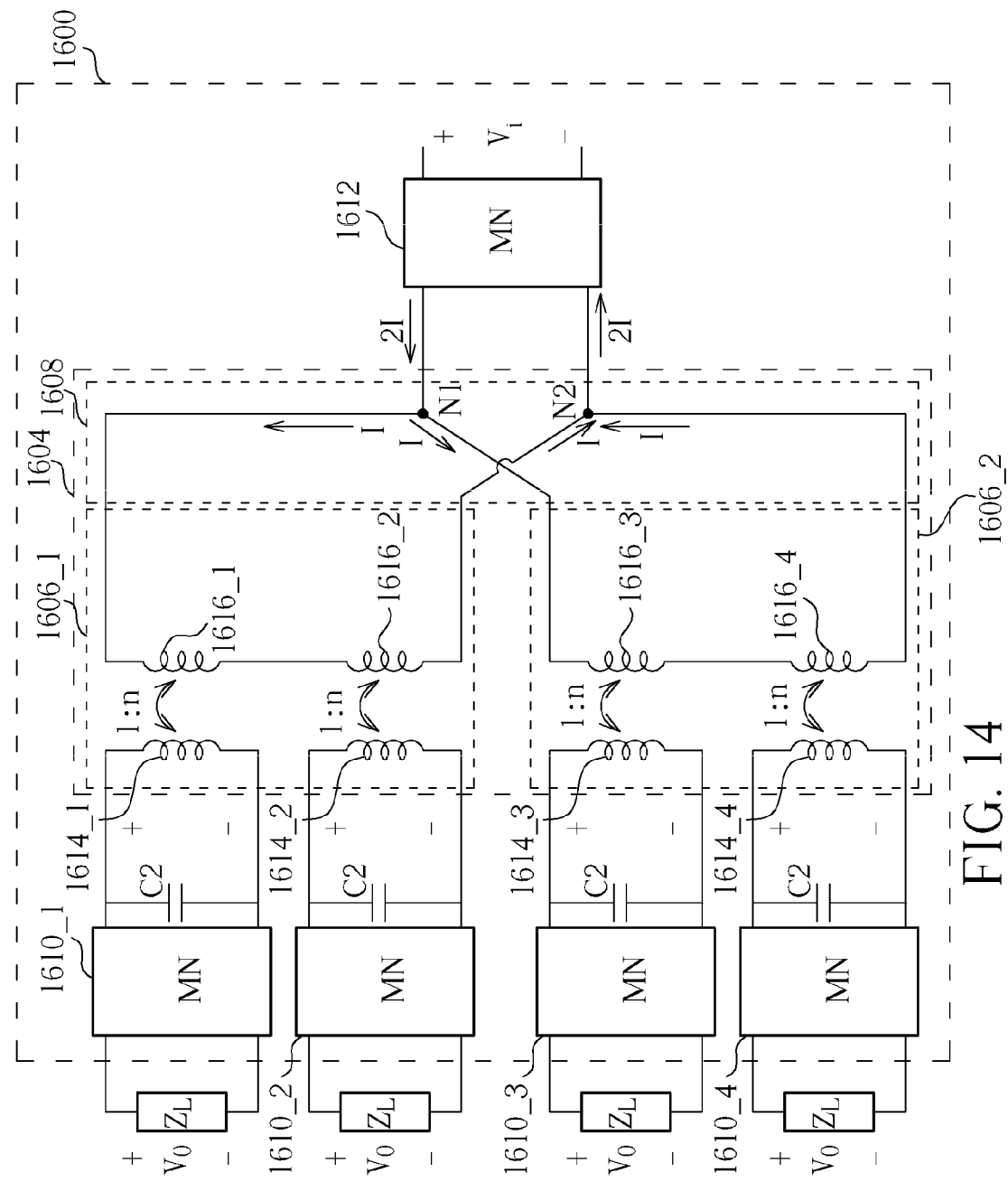
FIG. 14 is a schematic diagram illustrating a second exemplary embodiment of a power splitting system according to the present invention.

FIG. 14 is a schematic diagram illustrating a second exemplary embodiment of a power splitting system according to the present invention. The exemplary power splitting system 1600 includes a transformer power splitter 1604 having an input port for receiving an input $V_i$ and a plurality of output ports respectively coupled to output loads $Z_L$. The transformer power splitter 1604 is configured to include a plurality of voltage splitters 1606_1, 1606_2 and a current splitter 1608. The voltage splitters 1606_1, 1606_2 are formed by a plurality of secondary winding conductors 1614_1, 1614_2, 1614_3, 1614_4 and a plurality of primary winding conductors 1616_1, 1616_2, 1616_3, 1616_4. The voltage splitter 1606_1 is configured to split a voltage across two ends thereof into a plurality of voltages across therein (e.g., the voltage across the primary winding conductor 1616_1 and the voltage across the primary winding conductor 1616_2); similarly, the voltage splitter 1606_2 is configured to split a voltage across two ends thereof into a plurality of voltages across therein (e.g., the voltage across the primary winding conductor 1616_3 and the voltage across the primary winding conductor 1616_4). The current splitter 1608 is configured to split a current corresponding to the input $V_i$ at the input port into currents flowing through the voltage splitters 1606_1 and 1606_2 (e.g., 2I=I+I). In this way, the input $V_i$ at the input port is split into a plurality of outputs $V_o$ at the output ports of the transformer power splitter 1604.

As shown in FIG. 14, the secondary winding conductor 1614_1 is electrically connected between a positive terminal (+) and a negative terminal (−) of a corresponding output port and is further magnetically coupled to the primary winding conductor 1616_1, the secondary winding conductor 1614_2 is electrically connected between a positive terminal (+) and a negative terminal (−) of a corresponding output port and is further magnetically coupled to the primary winding conductor 1616_2, the secondary winding conductor 1614_3 is electrically connected between a positive terminal (+) and a negative terminal (−) of a corresponding output port and is further magnetically coupled to the primary winding conductor 1616_3, and the secondary winding conductor 1614_4 is electrically connected between a positive terminal (+) and a negative terminal (−) of a corresponding output port and is further magnetically coupled to the primary winding conductor 1616_4. In addition, a plurality of matching networks (MNs) 1610_1, 1610_2, 1610_3, 1610_4, 1612 are implemented in the power splitting system 1600 for impedance matching purposes. In this exemplary embodiment shown in FIG. 14, only four output ports are shown for illustrative purposes; however, this is not meant to be a limitation of the present invention. In other alternative designs obeying the spirit of the present invention are possible, the transformer power splitter may be implemented to split the input power of an input signal and accordingly generate more than four output signals, depending upon design considerations.

Similar to the topology of the primary winging conductors 1216_1-1216_4 shown in FIG. 11, the primary winding conductors 1616_1-1616_4 in this exemplary embodiment shown in FIG. 14 are also configured in a topology including series connection and parallel connection between a positive terminal N1 and a negative terminal N2 of the input port; however, the primary winding conductors 1616_1 and 1616_2 in this exemplary embodiment are connected in series between the positive terminal N1 and the negative terminal N2 of the input port, and the primary winding conductors 1616_3 and 1616_4 in this exemplary embodiment are connected in series between the positive terminal N1 and the negative terminal N2 of the input port. As one can see from the figure, the series connection of the primary winding conductors 1616_1 and 1616_2 and the series connection of the primary winding conductors 1616_3 and 1616_4 are connected in parallel between the positive terminal N1 and the negative terminal N2 of the input port.

Provided that the turn ratio is 1:1, the output impedance viewed from the output port of the secondary winding conductor 1614_1 is therefore determined by the primary winding conductor 1616_1 connected to the primary winding conductor 1616_2 in series and then further connected to a series connection of the primary winding conductors 1616_3 and 1616_4 in parallel; similarly, the output impedance viewed from the output port of the secondary winding conductor 1614_2 is therefore determined by the primary winding conductor 1616_2 connected to the primary winding conductor 1616_1 in series and then further connected to a series connection of the primary winding conductors 1616_3 and 1616_4 in parallel, the output impedance viewed from the output port of the secondary winding conductor 1614_3 is therefore determined by the primary winding conductor 1616_3 connected to the primary winding conductor 1616_4 in series and then further connected to a series connection of the primary winding conductors 1616_1 and 1616_2 in parallel, and the output impedance viewed from the output port of the secondary winding conductor 1614_4 is therefore determined by the primary winding conductor 1616_4 connected to the primary winding conductor 1616_3 in series and then further connected to a series connection of the primary winding conductors 1616_1 and 1616_2 in parallel. It is readily appreciated that the output impedance viewed from the output ports is substantially the same due to the primary winding conductors 1616_1-1616_4 connected through a novel topology including series connection and parallel connection between the positive terminal N1 and the negative terminal N2 of the input port. In this way, the input power $P_i$ of the input $V_i$ is evenly split, thereby generating a plurality of output signals each having the same output power $P_o$ (e.g., $$P_o = \frac{1}{4} P_i$$

in this exemplary embodiment).

Figure 15:
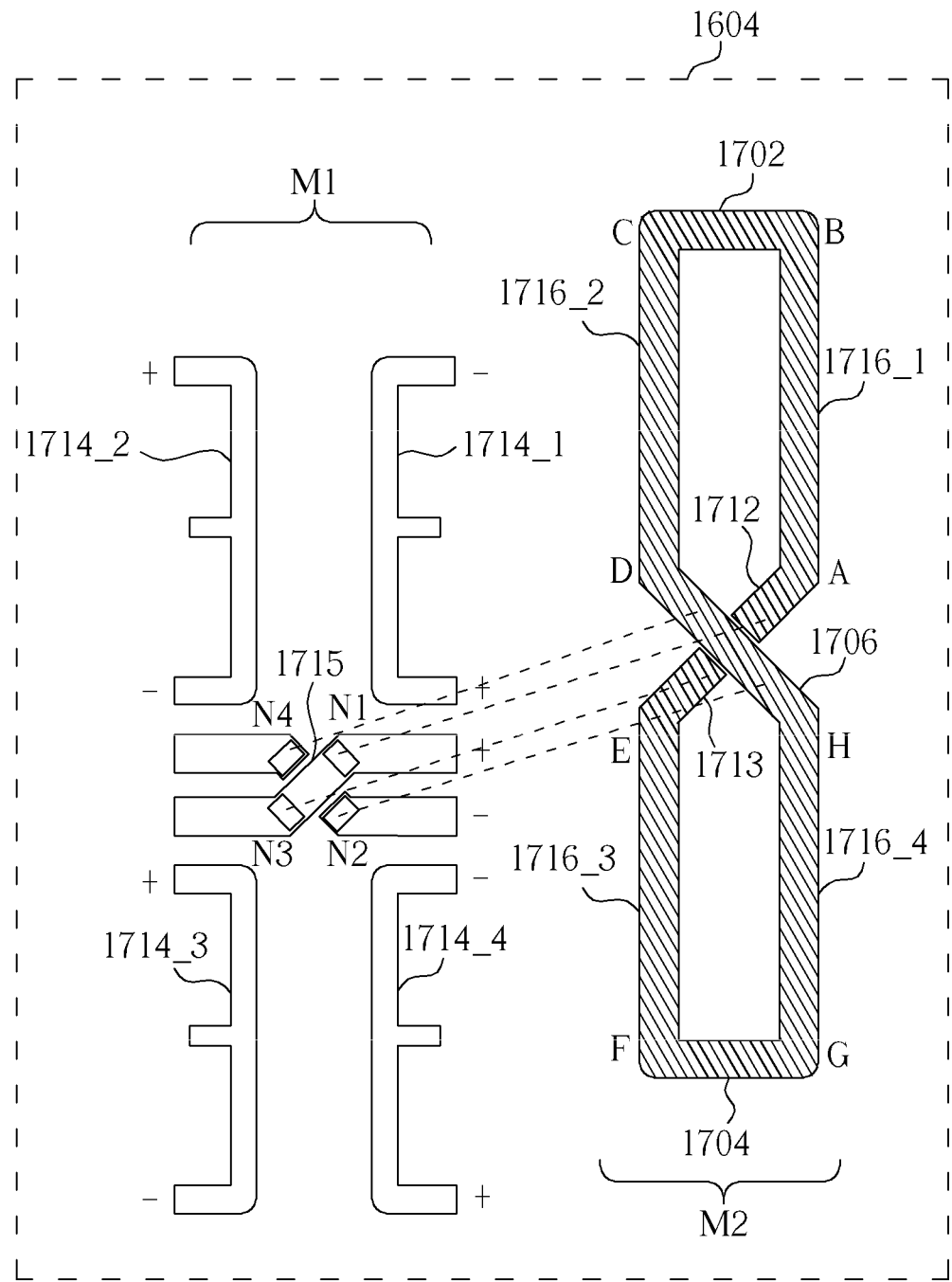
FIG. 15 is a diagram illustrating another exemplary layout of a transformer power splitter according to the present invention.

Based on the circuit configuration of the novel transformer power splitter 1604 shown in FIG. 14, a layout of the on-chip transformer power splitter 1604 should be well defined in an integrated circuit to achieve the desired objective of making the output impedance at the output ports substantially the same. Please refer to FIG. 15, which is a diagram illustrating another exemplary layout of a transformer power splitter according to the present invention. For example, in one implementation, the exemplary layout shown in FIG. 15 is to realize the transformer power splitter 1604 in FIG. 14. Shown on the left side are conductive metal lines routed on a first metal layer M1, while shown on the right side are conductive metal lines routed on a second metal layer M2 different from the first metal layer M1. As mentioned above, the naming of the metal layers is not meant to limit the position relationship of the first and second metal layers M1 and M2. For example, in one implementation, the first metal layer M1 is configured to be disposed under the second metal layer M2; however, in another implementation, the first metal layer M1 could be alternatively disposed above the second metal layer M2. In short, the metal layers on which the primary and secondary winding conductors are routed depend upon design requirements. In addition, it should be noted that the layout design shown in FIG. 15 is for illustrative purposes only, and is not meant to be a limitation of the present invention. That is to say, other alternative layout designs obeying the spirit of the present invention still fall within the scope of the present invention.

In this embodiment using the layout in FIG. 15 to realize the transformer power splitter 1604 in FIG. 14, the secondary winding conductors 1614_1-1614_4 and the primary winding conductors 1616_1-1616_4 in FIG. 14 are therefore implemented using secondary winding conductors 1714_1-1714_4 and the primary winding conductors 1716_1-1716_4 in FIG. 15, respectively. As clearly illustrated in FIG. 15, the secondary winding conductors 1714_1-1714_4 are routed on the first metal layer M1 of the integrated circuit symmetrically, and the primary winding conductors 1716_1-1716_4 are also routed on the second metal layer M2 of the integrated circuit symmetrically. In this exemplary embodiment, the first primary winding conductor 1716_1 (between nodes A and B) and the second primary winding conductor 1716_2 (between nodes C and D) are electrically connected by a first conductor 1702 routed between nodes B and C on the second metal layer M2; the third primary winding conductor 1716_3 (between nodes E and F) and the fourth primary winding conductor 1716_4 (between nodes H and G) are electrically connected by a second conductor 1704 routed between nodes F and G on the second metal layer M2; the second primary winding conductor 1716_2 and the fourth primary winding conductor 1716_4 are electrically connected by a third conductor 1706 routed between nodes D and H on the second metal layer M2; and the first primary winding conductor 1716_1 and the third primary winding conductor 1716_3 are electrically connected by a fourth conductor electrically connected between nodes A and E, where the fourth conductor has a first section 1712 and a second section 1713 routed on the second metal layer M2, and a third section 1715 routed on the first metal layer M1, and the first section 1712, the second section 1713, and the third section 1715 are electrically connected through vias represented by broken lines shown in FIG. 15. Furthermore, the positive terminal N1 is electrically connected to the first section 1712 through a via, and the negative terminal N2 is electrically connected to the third conductor 1706 through a via. A projected pattern of the third section 1715 on the second metal layer M2 intersects the third conductor 1706, which is more clearly shown in the following figure.

In this exemplary embodiment, as the connecting node N4 is electrically connected to the third conductor 1706 through a via, the connecting node N4 is therefore electrically connected to the negative terminal N2. Regarding the connecting node N3, it is electrically connected to the positive terminal N1 through the third section 1715. In a case where a fully symmetric layout is desired to achieve optimum electrical characteristics, the connecting nodes N3 and N4 and related vias electrically connected to the connecting nodes N3 and N4 may be implemented. However, in other embodiments, the connecting nodes N3 and N4 and related vias electrically connected to the connecting nodes N3 and N4 may be omitted.

Figure 16:
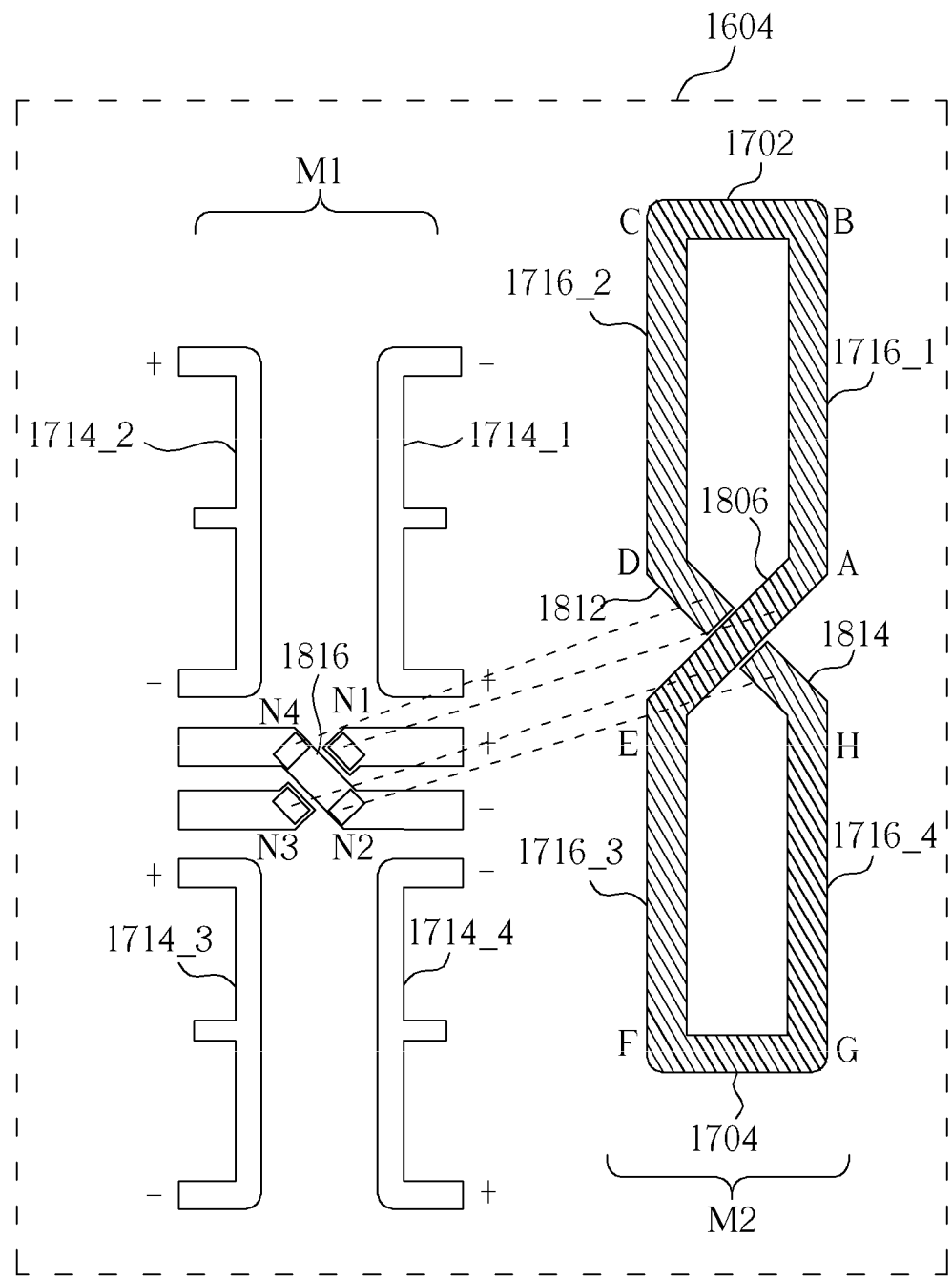
FIG. 16 is a diagram illustrating yet another exemplary layout of a transformer power splitter according to the present invention.

The layout shown in FIG. 15 is for illustrative purposes. Other alternative designs obeying the spirit of the invention are possible. Please refer to FIG. 16, which is a diagram illustrating yet another exemplary layout of a transformer power splitter according to the present invention. For example, the exemplary layout shown in FIG. 16 is an alternative exemplary layout of the transformer power splitter 1604 shown in FIG. 14. The layout shown in FIG. 16 is similar to that shown in FIG. 15. The difference is the connection configuration of nodes A, D, E, and H. As shown in FIG. 16, the first primary winding conductor 1716_1 and the third primary winding conductor 1716_3 are electrically connected by a third conductor 1806 routed between nodes A and E on the second metal layer M2, and the second primary winding conductor 1716_2 and the fourth primary winding conductor 1716_4 are electrically connected by a fourth conductor electrically connected between nodes D and H, where the fourth conductor has a first section 1812 and a second section 1814 routed on the second metal layer M2, and a third section 1816 routed on the first metal layer M1. In addition, the first section 1812, the second section 1814, and the third section 1816 are electrically connected through vias represented by broken lines shown in FIG. 16. In this embodiment, the positive terminal N1 is electrically connected to the third conductor 1806 through a via, and the negative terminal N2 is electrically connected to the second section 1814 through a via. Furthermore, a projected pattern of the third section 1816 on the second metal layer M2 intersects the third conductor 1806. As a person skilled in the art would readily understand the layout of the remaining portions in FIG. 16 after reading above disclosure directed to the layout shown in FIG. 15, further description is omitted here for brevity.

Figure 17:
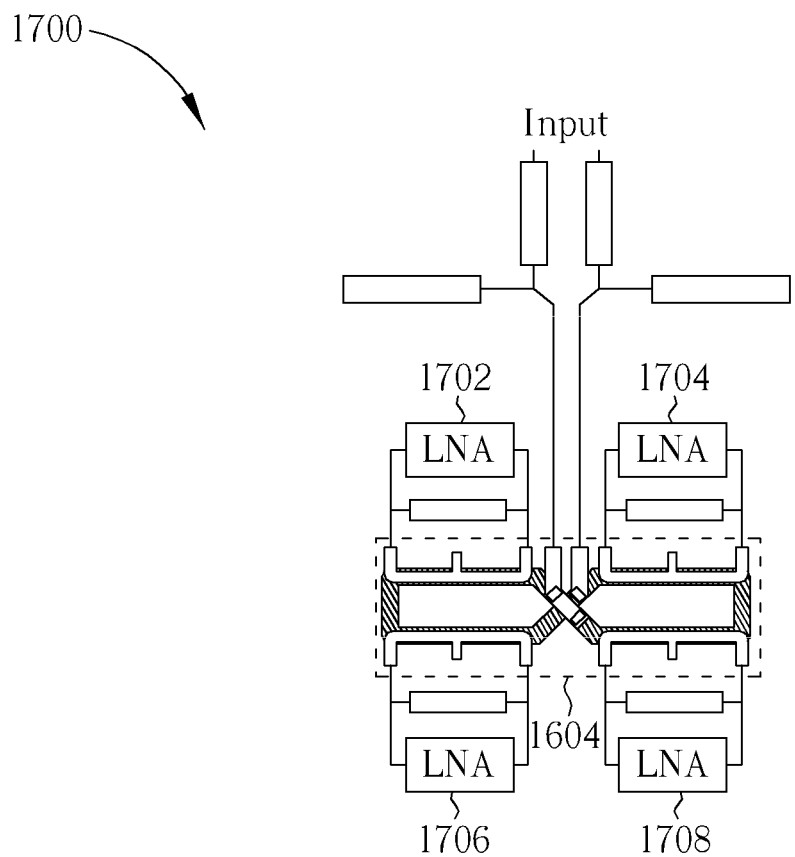
FIG. 17 shows an exemplary implementation of a power splitting system using the power splitter with the layout shown in FIG. 15.

Please refer to FIG. 15 in conjunction with FIG. 17. FIG. 17 shows an exemplary implementation of a power splitting system 1700 using the power splitter 1604 with the layout shown in FIG. 15. The power splitting system 1700 may be a receiver front-end for receiving the input signal from an antenna, and splitting the input power of the input signal to thereby generate a plurality of output signals to a plurality of low-noise amplifiers (LNAs) 1702, 1704, 1706, 1708, respectively. As clearly illustrated in FIG. 17, the overall transformer power splitter substantially has a symmetric layout. That is, as illustrated in FIG. 15 and FIG. 16, the secondary winding conductors 1714_1-1714_4 are symmetrically routed on the first metal layer M1, and the primary winding conductors 1716_1-1716_4 are symmetrically routed on the second metal layer M2. In this way, due to the well-defined substantially symmetric layout, the output impedance viewed from the output ports is substantially the same regardless of the coupling efficiency of the transformers implemented in the transformer power splitter. Furthermore, as the transformers in this exemplary embodiment are implemented using a broadside design according to the exemplary layouts shown in FIG. 15 and FIG. 16, the transformer coupling efficiency is improved. In this way, the on-chip transformer power splitter configured using the circuit layout shown in FIG. 15 or FIG. 16 can achieve high transformer coupling efficiency and high power splitting efficiency.

In addition, the present invention further proposes a novel load impedance optimization technique detailed hereinafter. Please refer to the exemplary embodiment shown in FIG. 11 again. An optional capacitive component (e.g., a capacitor C1) could be electrically connected between the positive terminal (+) and the negative terminal (−) of an output port for tuning the load impedance. As the transformer generally include parasitic inductors, the capacitor C1 is therefore implemented for resonating the transformer inductance to alleviate the effect caused by parasitic inductors, thereby properly tuning load impedance toward a desired value. Similarly, as shown in the other exemplary embodiment in FIG. 14, an optional capacitive component (e.g., a capacitor C2) could be electrically connected between the positive terminal (+) and the negative terminal (−) of an output port for tuning the load impedance.

Furthermore, provided that the layout symmetry is retained, the layout shown in FIG. 12 could be properly modified to shorten the distance between the positive terminal N1 and the negative terminal N2 for reducing the layout complexity. For example, the top-right portion shown in FIG. 12 can be bent clockwise with respect to the connecting node N3, and the bottom-right portion shown in FIG. 12 can be bent counterclockwise with respect to the connecting node N3, whereby the distance between the positive terminal N1 and the negative terminal N2 is shortened. In order to keep the overall layout symmetric, the partial layout of the transformer power splitter 1204 on the first metal layer M1 is properly bent in response to the aforementioned modification made to the partial layout of the transformer power splitter 1204 on the second metal layer M2.

Please note that the power splitting performance of the transformer power splitters of the above embodiments are independent of the transformer design for all frequency bands. In other words, the transformer power splitters of the above embodiments can be not limited to only the high-frequency applications, such as mmWave applications.

As mentioned above, the transformer power splitter 1204 with the layout design shown in FIG. 13 and the transformer power splitter 1604 with the layout design shown in FIG. 17 are capable of evenly splitting the input power of the input signal to thereby generate a plurality of output signals, each having the same output power, to a plurality of LNAs 1352-1358/1702-1708, respectively. It should be noted that the input signal may include a plurality of signal components. By way of example, but not limitation, the input signal may include a desired signal component, a blocker/jamming signal component, and a noise component. As each of the transformer power splitters 1204 and 1604 can evenly split the input power of the input signal, each output signal accordingly include a desired signal component with one-fourth of the original desired signal power, a blocker/jamming signal component with one-fourth of the original blocker power, and a noise component with one-fourth of the original noise power. Suppose that the input signal-to-noise ratio (SNR) is unchanged, the noise figure (NF) requirement of each LNA remains unchanged. However, since the blocker power has a 6 dB reduction at each LNA, the IIP2 and IIP3 specification can be substantially relaxed by 9 dB and 7.7 dB, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transformer power splitter having a plurality of pairs of output terminals and an pair of input terminals, and the transformer power splitter for splitting a input power of the pair of input terminals, the transformer power splitter comprising:
   a plurality of secondary winding conductors, electrically connected to the plurality of pairs of output terminals respectively, wherein each of the secondary winding conductors is electrically connected between a positive terminal and a negative terminal of a corresponding output terminals; and
   a plurality of primary winding conductors, magnetically coupled to the secondary winding conductors respectively, wherein the primary winding conductors are configured in a topology including series and parallel connections between a positive terminal and a negative terminal of the pair of input terminals.

2. The transformer power splitter of claim 1, further comprising a voltage splitter, wherein the primary winding conductors and the secondary winding conductors are configured to form a plurality of current splitters electrically connected to the voltage splitter, each of the current splitter is configured to split a current flowing thereto, and the voltage splitter is configured to split a voltage corresponding to an input at the pair of output terminals and accordingly generate voltages across the current splitters.

3. The transformer power splitter of claim 1, wherein the primary winding conductors comprise a first primary winding conductor, a second primary winding conductor, a third primary winding conductor, and a fourth primary winding conductor; the first primary winding conductor and the second primary winding conductor are electrically connected in parallel between the positive terminal of the pair of input terminals and a connecting node; and the third primary winding conductor and the fourth primary winding conductor are electrically connected in parallel between the connecting node and the negative terminal of the pair of input terminals.

4. The transformer power splitter of claim 3, being an on-chip transformer power splitter formed in an integrated circuit.

5. The transformer power splitter of claim 4, wherein the primary winding conductors and the secondary winding conductors are routed on the integrated circuit utilizing a first metal layer and a second metal layer; a partial layout of the transformer power splitter on the first metal layer is substantially symmetric; and a partial layout of the transformer power splitter on the second metal layer is substantially symmetric.

6. The transformer power splitter of claim 5, wherein the secondary winding conductors comprise a first secondary winding conductor magnetically coupled to the first primary winding conductor, and a second secondary winding conductor magnetically coupled to the second primary winding conductor; the first secondary winding conductor includes a first section and a second section routed on the first metal layer, and a third section routed on the second metal layer and interconnecting the first section and the second section of the first secondary winding conductor through vias; the first primary winding conductor is routed on the second metal layer; the second secondary winding conductor is routed on the first metal layer, where a projected pattern of the third section of the first secondary winding conductor on the first metal layer intersects the second secondary winding conductor; the second primary winding conductor has a first section and a second section routed on the second metal layer, and a third section routed on the first metal layer and interconnecting the first section and the second section of the second primary winding conductor through vias, where a projected pattern of the third section of the second primary winding conductor on the second metal layer intersects the first primary winding conductor.

7. The transformer power splitter of claim 6, wherein a projected pattern of the first secondary winding conductor, the second secondary winding conductor, the first primary winding conductor, and the second primary winding conductor on a plane parallel to either the first metal layer or the second metal layer is substantially symmetric.

8. The transformer power splitter of claim 1, further comprising a current splitter, wherein the primary winding conductors and the secondary winding conductors form a plurality of voltage splitters electrically connected to the current splitter, each of the voltage splitters is configured to split a voltage across two ends thereof into voltages across therein, and the current splitter is configured to split a current corresponding to an input at the pair of input terminals and accordingly generate currents flowing through the voltage splitters.

9. The transformer power splitter of claim 1, wherein the primary winding conductors comprise a first primary winding conductor, a second primary winding conductor, a third primary winding conductor, and a fourth primary winding conductor; the first primary winding conductor and the second primary winding conductor are electrically connected in series between the positive terminal of the pair of input terminals and the negative terminal of the pair of input terminals; and the third primary winding conductor and the fourth primary winding conductor are electrically connected in series between the positive terminal of the pair of input terminals and the negative terminal of the pair of input terminals.

10. The transformer power splitter of claim 9, being an on-chip transformer power splitter formed in an integrated circuit.

11. The transformer power splitter of claim 10, wherein the secondary winding conductors are routed on a first metal layer of the integrated circuit symmetrically; and the primary winding conductors are routed on a second metal layer of the integrated circuit symmetrically.

12. The transformer power splitter of claim 11, wherein the first primary winding conductor and the second primary winding conductor are electrically connected by a first conductor routed on the second metal layer, the third primary winding conductor and the fourth primary winding conductor are electrically connected by a second conductor routed on the second metal layer, the second primary winding conductor and the fourth primary winding conductor are electrically connected by a third conductor, and the first primary winding conductor and the third primary winding conductor are electrically connected by a fourth conductor; one of the third conductor and the fourth conductor is routed on the second metal layer, while the other of the third conductor and the fourth conductor has a first section and a second section routed on the second metal layer, and a third section routed on the first metal layer and interconnecting the first section and the second section through vias, where a projected pattern of the third section on the second metal layer intersects the one of the third conductor and the fourth conductor routed on the second metal layer.

13. The transformer power splitter of claim 1, further comprising:
   at least one capacitive component, electrically connected between the positive terminal and the negative terminal of one pair of the plurality of pairs of output terminals, for tuning load impedance.

* * * * *